(12) United States Patent
Sakai et al.

(10) Patent No.: US 10,192,972 B2
(45) Date of Patent: *Jan. 29, 2019

(54) SEMICONDUCTOR FERROELECTRIC STORAGE TRANSISTOR AND METHOD FOR MANUFACTURING SAME

(71) Applicant: NATIONAL INSTITUTE OF ADVANCED INDUSTRIAL SCIENCE AND TECHNOLOGY, Tokyo (JP)

(72) Inventors: Shigeki Sakai, Tsukuba (JP); Wei Zhang, Tsukuba (JP); Mitsue Takahashi, Tsukuba (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/690,054

(22) Filed: Aug. 29, 2017

(65) Prior Publication Data

US 2018/0006130 A1    Jan. 4, 2018

Related U.S. Application Data

(63) Continuation of application No. 14/405,538, filed as application No. PCT/JP2013/065107 on May 30, 2013, now Pat. No. 9,780,186.

(30) Foreign Application Priority Data

Jun. 5, 2012  (JP) ................. 2012-127650

(51) Int. Cl.
*H01L 29/51*  (2006.01)
*H01L 21/28*  (2006.01)
(Continued)

(52) U.S. Cl.
CPC ...... *H01L 29/516* (2013.01); *H01L 21/02197* (2013.01); *H01L 21/02266* (2013.01);
(Continued)

(58) Field of Classification Search
CPC .................. H01L 29/516; H01L 29/78391
See application file for complete search history.

(56) References Cited

U.S. PATENT DOCUMENTS

| | | | |
|---|---|---|---|
| 6,198,119 B1 | 3/2001 | Nabatame et al. | |
| 2002/0089023 A1* | 7/2002 | Yu | ..... H01L 21/28194 257/411 |
| 2006/0081901 A1* | 4/2006 | Arimoto | ..... G11C 11/22 257/295 |

FOREIGN PATENT DOCUMENTS

| | | |
|---|---|---|
| JP | 2004-304143 | 10/2004 |
| JP | 2007-157982 | 6/2007 |
| JP | 2010-06221 | 3/2010 |

OTHER PUBLICATIONS

International Search Report dated Aug. 13, 2013 issued in corresponding PCT Application No. PCT/JP2013/065107 [with English Translation].

(Continued)

*Primary Examiner* — Marc Armand
(74) *Attorney, Agent, or Firm* — Hunton Andrews Kurth LLP

(57) ABSTRACT

Provided is a ferroelectric field effect transistor (FeFET) which has a wide memory window even if the ferroelectric film thickness is 200 nm or less, and which has excellent data retention characteristics, pulse rewriting endurance and the like. An FeFET which has a structure wherein an insulating body (11) and a gate electrode conductor (4) are sequentially laminated in this order on a semiconductor base (10) that has a source region (12) and a drain region (13). The insulating body (11) is configured by laminating a first insulating body (1) and a second insulating body (2) in this order on the base (10), and the second insulating body (2) is mainly composed of an oxide of strontium, calcium, bismuth and tantalum.

33 Claims, 21 Drawing Sheets

(51) Int. Cl.
*H01L 29/66* (2006.01)
*H01L 21/02* (2006.01)
*H01L 29/78* (2006.01)
*H01L 21/324* (2006.01)
*H01L 29/49* (2006.01)

(52) U.S. Cl.
CPC .. *H01L 21/28194* (2013.01); *H01L 21/28291* (2013.01); *H01L 21/324* (2013.01); *H01L 29/495* (2013.01); *H01L 29/513* (2013.01); *H01L 29/517* (2013.01); *H01L 29/6684* (2013.01); *H01L 29/78391* (2014.09)

(56) References Cited

OTHER PUBLICATIONS

X.L. Zhong et al., "Ferroelectric properties of Mn-Doped Bi3.15Nd0.85Ti3O12 thin films prepared under different annealing conditions", Materials Letters, vol. 62, pp. 2891-2893, 2008 (published Feb. 1, 2008).

M.C. Kao et al., "Effect of yttrium doping on microstructure and ferroelectric properties of Bi4Ti3O12 thin film", Materials Letters, vol. 62, pp. 3243-3245, 2008 (published Mar. 7, 2008).

Chun-Ming Wang et al., "Ferroelectric, dielectric and piezoelectric properties of potassium lanthanum bismuth titanate K0.5La0.5Bi4Ti4O15 ceramics", Materials Chemistry and Physics, vol. 110, pp. 402-405, 2008 (published Feb. 24, 2008).

Takeshi Kawae et al., "Reduced Leakage Current and Ferroelectric Properties in Nd and Mn Codoped BiFeO3 Thin Films", Applied Physics Express, vol. 1, Article No. 051601, 2008 (published Apr. 18, 2008).

M.C. Kao et al. "Microstructure and ferroelectric properties of Bi3.2Y0.8Ti3O12 thin films prepared by sol-gel method", Journal of Crystal Growth, vol. 310, pp. 2520-2524, 2008 (published Feb. 1, 2008).

G. D. Hu, et al., "Low leakage current and enhanced ferroelectric properties of Ti and Zn codoped BiFeO3 thin film", Applied Physics Letters, vol. 92, Article No. 192905, 2008 (published May 15, 2008).

N.L. Amsei Junior et al., "Structural and electrical properties of SrBi2(Ta0.5Nb0.5)2O9 thin films", Journal of Alloys and Compounds, vol. 458, pp. 500-503, 2008, (published Apr. 12, 2007).

Rasmi R. Das et al., "Ferroelectric Properties and Interfacial Characteristics of Ca Substituted Strontium Bismuth Tantalate Thin Films", International Journal of Modern Physics B, vol. 19, pp. 3173-3183, 2005 (published Feb. 26, 2005).

Tohru Higuchi, et al., "Ferroelectric and structural properties of Ba2-xSrxNaNb5O15 thin films prepared on La0.05Sr0.95TiO3 substrates", Journal of Applied Physics, vol. 103, Article No. 084108, 2008 (published Apr. 22, 2008).

Rasmi R. Das, et al., "CaBi2Ta2O9 ferroelectric thin films prepared by pulsed laser deposition", Applied Physics Letters, vol. 78, pp. 2925-2927, 2001 (published Mar. 19, 2001).

* cited by examiner

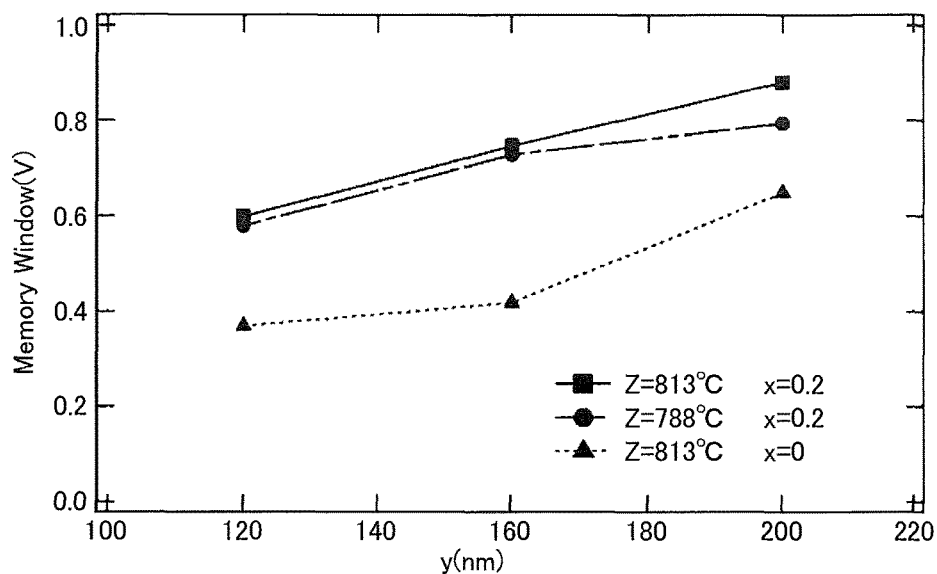
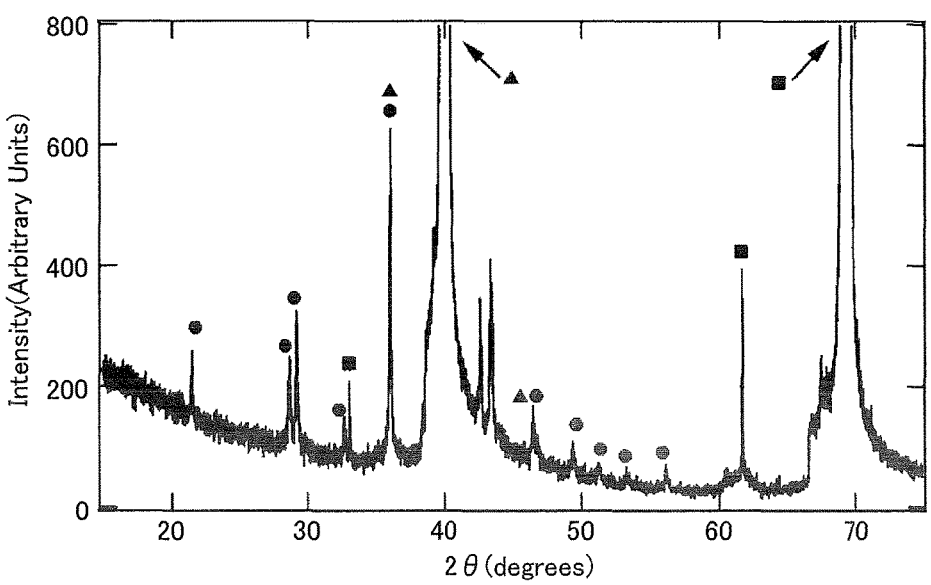

FIG. 42
(a)
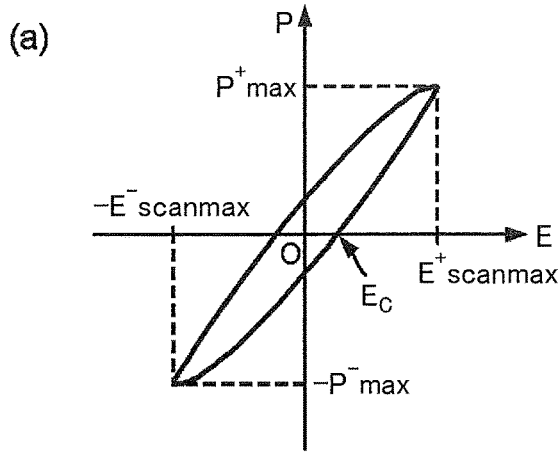
(b)
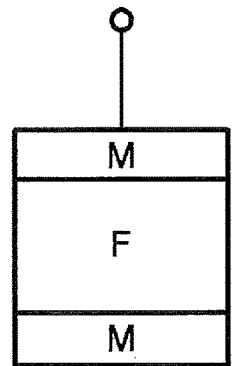
(c)
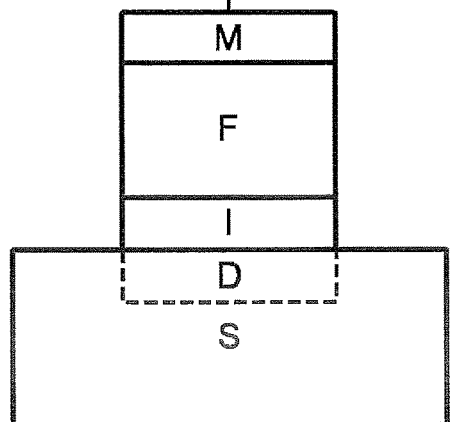

SEMICONDUCTOR FERROELECTRIC STORAGE TRANSISTOR AND METHOD FOR MANUFACTURING SAME

RELATED APPLICATIONS

The present application is a continuation of U.S. patent application Ser. No. 14/405,538, filed on Dec. 4, 2014, which is a national stage entry of International Application No. PCT/JP2013/065107, filed May 30, 2013, which claims priority to Japanese Application No. 2012-127650, filed Jun. 5, 2012, the contents of all of which are incorporated herein by reference.

TECHNICAL FIELD

The present invention relates to a semiconductor ferroelectric memory transistor, a semiconductor ferroelectric memory, and a method of production of a semiconductor ferroelectric memory transistor, more particularly relates to a semiconductor ferroelectric memory transistor where the transistor itself has a memory function and a method of manufacturing the same.

BACKGROUND ART

A field effect transistor of which gate insulating material includes a ferroelectric (below, "ferroelectric gate field electric transistor" or "FeFET") has in recent years been used for 64 kb NAND type flash memory array chips and has otherwise been marking important technical milestones. Compared with a conventional type of NAND flash memory, if applying FeFETs to a NAND flash memory (called "Fe-NAND"), the write voltage can be reduced to about one-third and therefore the endurance property of the number of times of program and erase cycling is remarkably good. That is, an Fe-NAND has the features of an energy saving, a memory which has high endurance property of the number of times of program and erase cycling. For use as a memory cell of a large scale integration memory, reduction of the dimensions of the FeFET has been demanded. To realize an FeFET with a small gate length $L_g$, the thickness of the gate insulator including the ferroelectric also usually has to be made thinner in terms of the fabrication process. If the thickness $L_i$ of the gate insulator with respect to $L_g=1$ μm is $L_i=400$ nm, the aspect ratio of the cross-section of the gate insulator is a low $A=L_i/L_g=0.4$ and there is little difficulty in the fabrication process such as the etching to form step differences and formation of a film covering step differences, but if becoming finer down to $L_g=100$ nm, $L_i=400$ nm and A=4 result and the difficulty of the fabrication process increases. In a large scale integration memory, $L_g$ becomes less than 100 nm and fine dimensions of down to 50 nm are sought. Inevitably, it will be demanded that $L_i$ be made smaller.

The fact that a transistor comprised of an insulating buffer layer Hf—Al—O formed on a silicon Si, further a ferroelectric layer formed on the insulating buffer layer Hf—Al—O, and further a gate metal formed on the ferroelectric layer is a ferroelectric gate field effect transistor excellent in data retention characteristic and pulse rewrite endurance property is disclosed in PLT 1. If an FeFET of which structure is Pt/SrBi$_2$Ta$_2$O$_9$/Hf—Al—O/Si comprising a gate metal of Pt, a ferroelectric layer material of SrBi$_2$Ta$_2$O$_9$, and an insulating buffer layer of Hf—Al—O formed on an Si substrate, as shown by the example in PLT 1, has a ferroelectric layer of a thickness of 400 nm, the memory window, by which the characteristic of the drain current $I_d$ with respect to the gate voltage $V_g$ ($I_d$-$V_g$ characteristic) of the FeFET is shown, is 1.6V. In terms of an n-channel FeFET, the $I_d$-$V_g$ curve which is measured by increasing $V_g$ from negative to positive and the $I_d$-$V_g$ curve which is measured by decreasing $V_g$ from positive to negative exhibit different paths and have different threshold voltages. In other words, the $I_d$-$V_g$ curve which is measured by changing $V_g$ from negative to positive and returning it to negative (or changing it from positive to negative and returning it to positive) draws a hysteresis curve. The difference in these threshold voltages is the "memory window". In this Description, the voltages where $I_d=1\times10^{-6}$ A on the two different paths are defined as the "threshold voltages" and the difference is defined as the "memory window". Note that, in many cases, in the region smaller than the threshold voltages called the "subthreshold voltage", no matter where the memory window is compared with, the memory window does not change much in size. The two states which correspond to the different threshold voltages are assigned the logical states of "0" and "1". Which of these is "1" and which of these is "0" can be defined at each instance, and so it is not important. The 1.6V memory window can be said to be sufficient to discriminate the two states. When arranging a large number of FeFETs in an array to obtain a large scale integration memory, the variation in the two threshold voltages which correspond to the two states in the different FeFETs becomes a problem. The variation in threshold voltages of FeFETs is caused by variations in gate dimensions and film thickness etc. If the average value of the memory windows of a large number of FeFETs becomes so small as to be unable to be ignored compared with the variations in threshold values, sometimes error will occur in the discrimination of "0" and "1" of the FeFET forming a large scale integration memory. In general, the memory window of an FeFET forming a large scale integration memory is preferably large.

CITATIONS LIST

Patent Literature

PLT 1: Japanese Patent Publication No. 2004-304143A

Nonpatent Literature

NPLT 1: Materials Letters, vol. 62 pp. 2891-2893, 2008
NPLT 2: Materials Letters, vol. 62 pp. 3243-3245, 2008
NPLT 3: Materials Chemistry and Physics, vol. 110, pp. 402-405, 2008
NPLT 4: Applied Physics Express, vol. 1, Article Number 051601, 2008
NPLT 5: Journal of Crystal Growth, vol. 310, pp. 2520-2524, 2008
NPLT 6: Applied Physics Letters, vol. 92, Article Number 192905, 2008
NPLT 7: Journal of Alloys and Compounds, vol. 458, pp. 500-503, 2008
NPLT 8: International Journal of Modern Physics B, vol. 19, pp. 3173-3183, 2005
NPLT 9: Journal of Applied Physics, vol. 103, Article Number 084108, 2008
NPLT 10: Applied Physics Letters, vol. 78, pp. 2925-2927, 2001

SUMMARY OF INVENTION

Technical Problem

If aiming at a large scale integration memory, an FeFET with a gate length $L_g$ under 100 nm becomes necessary.

However, due to reasons in the above fabrication process, it is preferable to avoid a configuration where the ratio A is large. In a Pt/SrBi$_2$Ta$_2$O$_9$/Hf—Al—O/Si structure FeFET, the film thickness of the ferroelectric SrBi$_2$Ta$_2$O$_9$ is preferably made 200 nm or less, but as shown in the later reference example, if making the ferroelectric film thickness smaller, the memory window becomes smaller. Because devisal of designing the control circuit to suppress variation in the threshold voltages of the large number of FeFETs which form a large scale integration memory may be done, so an FeFET which uses a 200 nm film thickness SrBi$_2$Ta$_2$O$_9$ is not necessarily inconvenient in practice. However, the problem of development of a ferroelectric material which retains the excellent data retention characteristic, excellent pulse rewrite endurance property, and other excellent performance inherently possessed by an FeFET while enabling a wide memory window even with a 200 nm or less ferroelectric film thickness remains to be solved. A NAND flash memory, which is comprised of FETs which have floating gates and which represents the current mainstream in mass production, requires a pulse rewrite endurance property of 100,000 (10$^4$) or so cycles. Therefore, the device of the present invention is clearly required to have a characteristic of a pulse rewrite endurance property of over 100,000 cycles.

The basic performance of a ferroelectric material can be expressed by the relationship between an electric field (E) which is applied and an electric polarization (P) in the ferroelectric responding to this (P-E curve) as shown in FIG. 42(a). If sweeping the electric field between $-E^-_{scanmax}$ and $E^+_{scanmax}$ the electric polarization of the ferroelectric draws a hysteresis curve such as in FIG. 42(a). At $E=E^-_{canmax}$ P takes its maximum value $P^+_{max}$, while at $E=-E^-_{scanmax}$ P takes its maximum value $-P^-_{max}$ in the negative direction. At the right side hysteresis curve, the electric field where P=0 is the coercive electric field $E_c$. If enlarging $-E^-_{scanmax}$ and $E^+_{scanmax}$, $-P^-_{max}$ and $P^+_{max}$ also become larger. If the added $-E^-_{scanmax}$ and $E^+_{scanmax}$ are in ranges giving non-saturated electric polarization, the coercive electric field $E_c$ also becomes larger. If this is in a range giving saturated electric polarization, $E_c$ does not become larger than that.

The P-E curve, as shown in FIG. 42(b), is measured using an MFM structure of a ferroelectric (see F) sandwiched at its two sides by metal (M). Instead of an electric field, voltage is applied between the two metal layers. The voltage divided by the film thickness of the ferroelectric is the electric field. The thus measured P-E curve also applies to a large scale integration memory which combines MFM structure ferroelectric capacitors (C) and usual transistors (T) not using ferroelectrics to form units called "2T2C" and "1T1C" used as memory cells. On the other hand, in an MFIS gate structure, a typical structure of an FeFET where the transistor itself has the functions of a memory, as shown in FIG. 42(c), a metal (M), ferroelectric (see F), insulator (I), and semiconductor (S) are stacked. The characteristics of the F expressed by a P-E curve which is directly measured in an MFM structure and the characteristics of the F of an MFIS structure are different things. This is because sometimes a modified layer which cannot be formed in an MFM structure is formed between the I and F layers of an MFIS gate structure due to the heat treatment step for realizing the ferroelectricity. Further, the ferroelectricity depends on the crystal orientation of the ferroelectric, but the crystal orientation greatly depends on the state of the underlayer. This underlayer is the M layer in an MFM structure and an I layer in an MFIS structure, that is, differs depending on the structure. In an MFIS structure, the P-E characteristic of the F layer cannot be directly measured. On top of this, when applying voltage between the M and S of the MFIS, voltage is also applied to the depletion layer D which is formed near the I layer and S surface, so it is not possible to accurately determine how much voltage is applied to the F layer. In other words, the $-E^-_{scanmax}$ and $E^+_{scanmax}$ cannot be accurately determined. In the above way, in the same way as it being possible to predict the performance of a memory cell by actually evaluating a prototype of an MFM capacitor in a 2T2C or 1T1C memory, in an FeFET as well, actual fabrication of an MFIS transistor, rather than an MFM capacitor, and measurement and evaluation of its performance is necessary and essential in research and development of FeFETs.

In addition, the $E_c$ value which is obtained by evaluating a prototype of an MFM capacitor becomes one of the metrics enabling estimation of the memory window of an FeFET of an MFIS. This is because a large $E_c$ means a large hysteresis P-E curve, so a large memory window of the FeFET can be expected. As candidate materials with larger $E_c$ than SrBi$_2$Ta$_2$O$_9$ in the published citations, according to NPLTs 1 to 10, Mn-doped Bi$_{3.15}$Nd$_{0.85}$Ti$_3$O$_{12}$, Y-doped Bi$_4$Ti$_3$O$_{12}$, Ka$_{0.5}$La$_{0.5}$Bi$_4$Ti$_4$O$_{15}$, Nd- and Mn-doped BiFeO$_3$, Bi$_{3.2}$Y$_{0.8}$Ti$_3$O$_{12}$, Ti- and Zn-doped BiFeO$_3$, SrBi$_2$(Ta$_{0.5}$Nb$_{0.5}$)$_2$O$_9$, Sr$_{1-x}$Ca$_x$Bi$_2$Ta$_2$O$_9$, Ba$_{2-x}$Sr$_x$NaNb$_5$O$_{15}$, CaBi$_2$Ta$_2$O$_9$, etc. are known. However, repeating ourselves, the obtained $E_c$ is the value obtained by an MFM structure of a ferroelectric layer sandwiched by metal at its two sides. There are almost no examples of application of these to FeFETs. In an FeFET, both the characteristics of the semiconductor and ferroelectric have to be realized, but the state of the interface between the ferroelectric and semiconductor in an FeFET completely differs from an MFM structure. Even with a ferroelectric material which is known to exhibit a large $E_c$ in an MFM, it is not clear if a large memory window can be obtained in the case of using this for an MFIS FeFET. The reason is that as a result of fabrication of prototypes of MFIS FeFETs, the interface with the I layer was inherently poor. In addition, the state of the underlayer of the ferroelectric of the MFIS differed from that of an MFM, so the orientation of the ferroelectric crystal of the MFIS could not be effectively drawn out. Whether even with a 200 nm or less film thickness, a broad memory window, excellent data retention characteristic, excellent pulse rewrite endurance property, etc. can be obtained can only be determined by actually preparing prototypes of FeFETs and measuring them for performance. The inventors engaged in in-depth experiments and fabrication of prototypes without being bound by desktop theories and thereby completed the present invention. The present invention has as its object the provision of an FeFET which has a broad memory window, excellent data retention characteristic, excellent pulse rewrite endurance property, etc. even with a 200 nm or less ferroelectric film thickness.

Solution to Problem

To achieve the above object, according to the present invention, there is provided a semiconductor ferroelectric memory transistor comprising a semiconductor body which has a source region and a drain region on which an insulator and a gate electrode conductor are stacked in that order, wherein the insulator includes a ferroelectric insulator which is comprised of an oxide of strontium, calcium, bismuth, and tantalum.

Further, to achieve the above object, according to the present invention, there is provided a semiconductor ferroelectric memory transistor comprising a semiconductor body which has a source region and a drain region on which an insulator and a gate electrode conductor are stacked in that order, wherein the insulator is comprised of a first insulator and a second insulator stacked on the body in that order and wherein the second insulator is mainly comprised of an oxide of strontium, calcium, bismuth, and tantalum.

Further, to achieve the above object, according to the present invention, there is provided a semiconductor ferroelectric memory transistor comprising a semiconductor body which has a source region and a drain region on which an insulator and a gate electrode conductor are stacked in that order, wherein the insulator is comprised of a first insulator, second insulator, and third insulator stacked on the body in that order and wherein second insulator is mainly comprised of the oxide of strontium, calcium, bismuth, and tantalum.

Further, preferably, in the oxide of strontium, calcium, bismuth, and tantalum, a ratio of a strontium element to a calcium element is not more than two-thirds. Further, preferably, the oxide of strontium, calcium, bismuth, and tantalum has a bismuth layered perovskite-type crystal structure.

Further, preferably, the first insulator is an oxide of hafnium, an oxide of hafnium and aluminum, an oxide which includes hafnium, an oxide of strontium and titanium, a composite oxide of two or more of any of these, or an oxide layer stack of two or more of any of these. Further, preferably, the third insulator is an oxide of hafnium, an oxide of hafnium and aluminum, an oxide which includes hafnium, an oxide of strontium and titanium, a composite oxide of two or more of any of these, or an oxide layer stack of two or more of any of these. Further, preferably, the insulator has a film thickness of 250 nm or less and the first or third insulator has a film thickness of 15 nm or less.

Further, to achieve the above object, according to the present invention, there is provided a method of production of a semiconductor ferroelectric memory transistor which is comprised of a semiconductor body which has a source region and a drain region on which an insulator including a ferroelectric insulator comprised of an oxide of strontium, calcium, bismuth, and tantalum and a gate electrode conductor are stacked in that order, wherein the method includes a semiconductor body surface cleaning step, insulator deposition step, gate electrode conductor forming step, and heat treatment step.

Further, preferably, the heat treatment step has a temperature 760° C. to 833° C. More preferably, in the insulator deposition step, a step of deposition of a ferroelectric insulator comprised of an oxide of strontium, calcium, bismuth, and tantalum is pulse laser deposition or sputtering using a plurality of oxide targets with different ratios of composition of strontium, calcium, bismuth, and tantalum.

Advantageous Effects of Invention

According to the present invention, it becomes possible to form an FeFET which has a broad memory window, excellent data retention characteristic, excellent pulse rewrite endurance property, etc. in a 200 nm or thinner ferroelectric thin film, so it becomes possible to realize an FeFET with excellent characteristics by a fine gate length of under 50 nm and in turn becomes possible to provide a low power consumption nonvolatile memory using highly-integrated FeFETs.

BRIEF DESCRIPTION OF DRAWINGS

FIG. 16 is a view which shows a relationship of a memory window of a transistor of Example 2 and a film thickness y.

FIG. 17 shows a result of evaluation by x-ray diffraction of an XRD monitor sample corresponding to a transistor of Example 2 of y=120 nm prepared at Z=813° C.

FIG. 42(a) shows a P-E curve which shows a relationship of an electric field (E) and electric polarization (P) which occurs in a ferroelectric, (b) shows an MFM structure of a ferroelectric (F) sandwiched at its two sides by metal (M) for measurement of the P-E curve, and (c) shows the structure of an MFIS type FeFET.

DESCRIPTION OF EMBODIMENTS

First Embodiment

Figure 1:
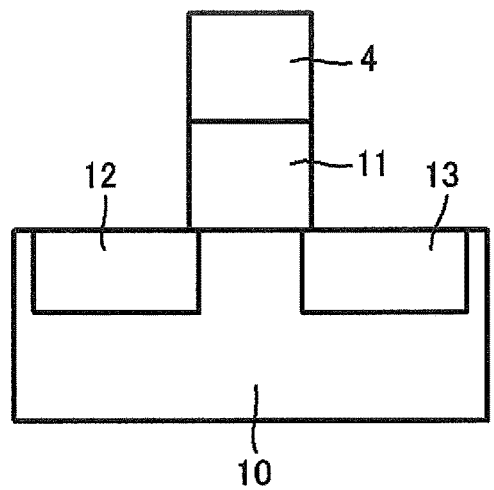
FIG. 1 is a cross-sectional view which shows a first embodiment of the present invention.

FIG. 1 is a cross-sectional view which shows a first embodiment of the present invention. Referential mark 10 indicates a semiconductor body. Here, a semiconductor substrate or semiconductor region which has a source region 12 and a drain region 13 will be referred to all together as a "semiconductor body". In the heat treatment step during the fabrication of the transistor, the surface of the semiconductor body sometimes is converted somewhat to an oxide layer. If the electric characteristics of the FeFET are maintained, this conversion itself is not a problem. In the present invention, this converted surface oxide layer is deemed to be included in the semiconductor body. The semiconductor body 10 may be silicon Si, may be germanium Ge, may be a mixed crystal of Si and Ge, or may be SiC or GaAs or another compound semiconductor. The invention is not limited to these materials. Furthermore, instead of a semiconductor substrate, an SOI (silicon on insulator) substrate may be used. In the figure, 11 indicates an insulator including a ferroelectric insulator comprised of an oxide of strontium, calcium, bismuth, and tantalum or Sr—Ca—Bi—Ta—O. 4 indicates a gate electrode conductor and may be any conductor which has a good interface with the insulator 11, but the material may also be Au, Pt, Ir, or other such precious metal or TiN or TaN or other such nitride conductor, IrO$_2$, RuO, LaSrCoO$_3$, SrRuO$_3$, RuO, ZnO, or other such oxide conductor. Further, it may be Pt/TiN/Ti, IrO$_2$/Ir, or other film stack. The semiconductor body 10 and the gate electrode conductor 4 in the second and third embodiments are similar.

Second Embodiment

Figure 2:
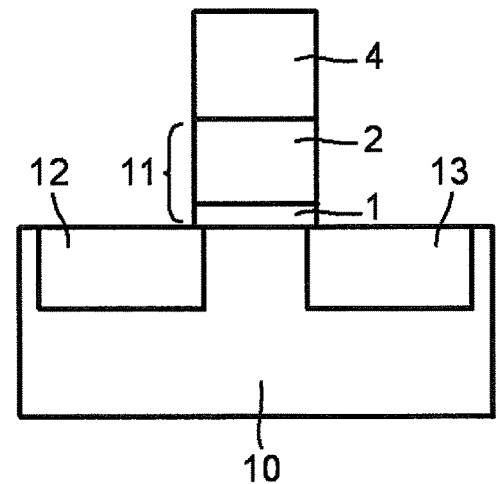
FIG. 2 is a cross-sectional view which shows a second embodiment of the present invention.

FIG. 2 is a cross-sectional view which shows a second embodiment of the present invention. An insulator 11 is comprised of a semiconductor body 10 on which a first insulator 1 and a second insulator 2 are stacked in that order. The second insulator 2 is mainly comprised of the strontium-calcium-bismuth-tantalum oxide Sr—Ca—Bi—Ta—O. The first insulator 1 is required to enable both the performance of the semiconductor body 10 and the performance of the second insulator 2 to be manifested and simultaneously be small in leakage current. If a halfnium oxide Hf—O, halfnium-aluminum oxide Hf—Al—O, halfnium silicate Hf—Si—O, or other oxide which contains halfnium, strontium-titanium oxide Sr—Ti—O, and composite oxides of these or laminates of these and further ZrO$_2$, zirconium silicate Zr—Si—O, Zr—Al—Si—O, La—Al—O, or lanthanum oxide La—O, the above demands can be satisfied.

Third Embodiment

Figure 3:
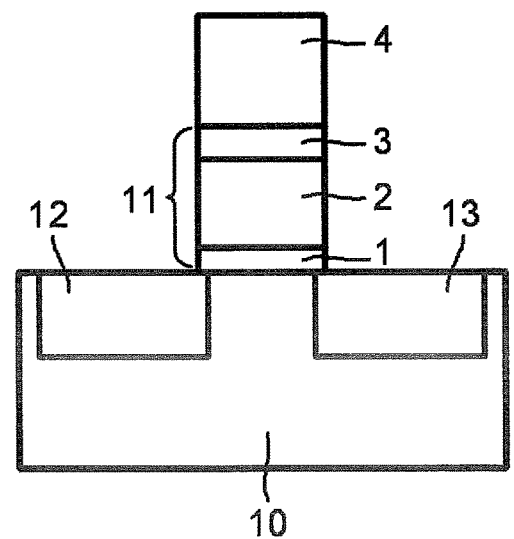
FIG. 3 is a cross-sectional view which shows a third embodiment of the present invention.

FIG. 3 is a cross-sectional view which shows a third embodiment of the present invention. An insulator 11 is comprised of a semiconductor body 10 on which a first insulator 1, a second insulator 2, and a third insulator 3 are stacked in that order. The second insulator 2 is mainly comprised of the strontium-calcium-bismuth-tantalum oxide Sr—Ca—Bi—Ta—O. The first insulator 1 is required to enable both the performance of the semiconductor body 10 and the performance of the second insulator 2 to be manifested and simultaneously be small in leakage current. If Hf—O, Hf—Al—O, Hf—Si—O, or other oxide which contains halfnium, Sr—Ti—O, silicon oxide Si—O, silicon nitride Si—N, silicon oxynitride Si—O—N, and composite films of these or laminated films of these, or further if $ZrO_2$, Zr—Si—O, Zr—Al—Si—O, La—Al—O, or La—O, the above demands can be satisfied. The third insulator 3 is required to enable both the performance of the gate electrode conductor and the performance of the second insulator 2 to be manifested and simultaneously be small in leakage current. If Hf—O, Hf—Al—O, Hf—Si—O, or other oxide which contains halfnium, Sr—Ti—O, and composite films or laminated films of these, or further if $ZrO_2$, Zr—Si—O, Zr—Al—Si—O, La—Al—O, La—O, or tantalum oxide Ta—O, the above demands can be satisfied.

In the embodiments of the present invention, the insulator 11 is not limited in film thickness, but considering the problem to be solved by the present invention, thickness of 250 nm or less becomes an important thickness. When applying voltage between the gate electrode conductor 4 and the semiconductor body 10 (below, "gate voltage"), applying a voltage to the insulator 2 providing the ferroelectricity as large as possible is effective for causing large switching of the polarization of the ferroelectric. In this sense as well, the first insulator 1 and the third insulator 3 are desirably mainly comprised of materials with large dielectric constants such as those listed above. Judging from the gist of the present invention, the first insulator 1 and the third insulator 3 should be made small in thicknesses with 15 nm or less being preferable thicknesses. Further, the preferable film thickness of the second insulator 2 is 200 nm or less.

Next, the method of production of an embodiment of the present invention will be explained. The method of production includes a surface cleaning step of the semiconductor body, the insulator deposition step, gate electrode conductor forming step, and heat treatment step.

Surface Cleaning Step of Semiconductor Body

First, a semiconductor body 10 is prepared. The standard surface cleaning method is used to clean the semiconductor body 10, then, if the material of the body is Si or SiC, dilute hydrofluoric acid or buffer hydrofluoric acid is used to remove the residual oxide layer at the surface.

Insulator Deposition Step

The method of formation of the first insulator 1 may be any method so long as one which forms a thin film. The pulse laser deposition method, sputtering method, vapor deposition method, MOCVD (metal organic chemical vapor deposition) method, MOD (metal organic decomposition) method, sol gel method, and ALD method are particularly preferable for realizing a 15 nm or less thickness. As the first insulator 1, an insulator film with a high dielectric constant is formed. It is also possible to form a very thin 1 nm or so or less silicon oxide film, silicon nitride film, or silicon oxynitride film between the semiconductor body and the high dielectric constant insulating film. To form the high dielectric constant insulator film, sometimes it is good to raise the temperature of the semiconductor body. While differing depending on the method of formation of the thin film, the temperature is preferably 20° C. to 775° C. The atmospheric gas at the time of formation of the first insulator 1 is preferably oxygen, nitrogen, or a mixed gas of the same.

At the step of production of the insulator 11 of the first embodiment and second insulator 2 of the second and third embodiments, an insulator mainly comprised of strontium-calcium-bismuth-tantalum oxide is formed. The method of formation is not particularly limited so long as a method of forming a thin film. The pulse laser deposition method, sputtering method, vapor deposition method, ALD method, MOCVD method, MOD method, sol gel method, etc. are effective. During formation, sometimes it is preferable to raise the temperature of the semiconductor body. While differing depending on the method of formation of the thin film, the temperature is preferably between 250° C. to 500° C. This step also serves as the heat treatment step for crystallizing the strontium-calcium-bismuth-tantalum oxide. The suitable substrate temperature at this time is suitably 700° C. to 830° C. The ratio of composition of elements of strontium and calcium is an important parameter. Any of these methods may be used to control the composition of elements of strontium and calcium. In the sputtering method, it is possible to prepare targets with different ratios of composition of elements. By preparing a target of strontium-bismuth-tantalum-oxygen and a target of calcium-bismuth-tantalum-oxygen and changing the sputtering conditions, it is possible to control the composition of elements of strontium and calcium in any way.

The method of using the pulse laser deposition method to form an insulator mainly comprised of a strontium-calcium-bismuth-tantalum oxide will be further explained. In the single target method as one of the methods, an oxide target with a set ratio of composition of strontium, calcium, bismuth, and tantalum is simply prepared and a laser beam is fired at this target to cause the target material to evaporate. Another method is the multiple target method. A plurality of oxide targets with different ratios of composition of strontium, calcium, bismuth, and tantalum are used. Here, the ratios of composition are positive values of zero or more. Each of the elements of strontium, calcium, bismuth, and tantalum is included in at least one of the oxide targets among the plurality of oxide targets. The deposition conditions and deposition time are set for each target and materials are evaporated from the prepared plurality of targets for deposition. In some cases, this process is repeated. In this way, the desired ratio of composition of elements of strontium-calcium-bismuth-tantalum oxide is deposited. If shortening the deposition time and increasing the number of times of repetition of the process, the elements will be mixed more evenly. The temperature of the semiconductor ferroelectric memory transistor during the fabrication step is suitably raised during deposition or heat treatment is performed at a suitable step after deposition to form a strontium-calcium-bismuth-tantalum oxide exhibiting a ferroelectricity. The multiple target method of which conditions are finely set enables a strontium, calcium, bismuth, and tantalum oxide film having the most suitable ratio of composition to be formed. This multiple target method can be used in the sputtering method as well. In the sputtering method, instead of firing a laser beam at the target, rf power is charged to cause electrodischarge in argon or a mixed gas of argon and oxygen and the target material is made to evaporate. The gas pressure during the sputtering deposition is set to a range of 0.01 Torr to 1 Torr, while the charged power is set to 200 W to 600 W.

The method of forming the third insulator 3 may be any method which forms a thin film. The pulse laser deposition method, sputtering method, vapor deposition method, MOCVD method, MOD method, sol gel method, or ALD method is particularly preferable for realizing a 15 nm or less thickness. The atmospheric gas at the time of forming the third insulator 3 is preferably oxygen, nitrogen, or a mixed gas of these.

Gate Electrode Conductor Forming Step

The method of forming the gate electrode conductor 4 may be any method which forms a thin film. There are the pulse laser deposition method, sputtering method, vapor deposition method, MOCVD method, MOD method, sol gel method, etc.

Heat Treatment Step

The main object of this step is to crystallize the insulator comprised of strontium-calcium-bismuth-tantalum oxide. Due to this crystallization, the ferroelectricity is suitably expressed. The temperature of this heat treatment step is indicated as "Z". Various methods are allowed such as in an oxygen atmosphere, in a mixed gas atmosphere of oxygen and nitrogen, in a mixed gas atmosphere of oxygen and argon, etc. The pressure is not limited atmospheric pressure. Conditions of pressure reduced from atmospheric pressure or increased from it may be suitably selected.

The monitor sample for evaluation by the x-ray diffraction method explained later (below, "XRD monitor sample") was prepared through the steps from the above "semiconductor body surface cleaning step" to "heat treatment step". The x-ray diffraction method was performed by the θ-2θ method. To create the transistor structure, for example, patterns of organic resist or inorganic resist is formed over a gate electrode conductor by the photolithography or electron beam lithography method, then the reactive ion etching method, high density reactive ion etching method, or ion milling method is used to remove the parts not covered by the above resists. In a self-aligned-gate structure transistor, the ion implantation method or other impurity doping method is used to add an impurity to the semiconductor body and annealing to activate the impurity is suitably performed. The step of annealing for activating the impurity can also double as a heat treatment step for suitably expressing the above ferroelectricity. A non-self aligned-gate structure transistor needs only to etch just the gate metal conductor to perform the above pattern etching. Resist patterns are separately formed and are etched until the source regions and drain regions formed in advance on the semiconductor body appear.

Example 1

Example 1 relates to the second embodiment (see FIG. 2). A semiconductor body for an n-channel transistor made by a silicon material was used. The material of the first insulator was halfnium-aluminum oxide. The pulse laser deposition method was used. The target was comprised of Hf, Al, and O and the ratio of composition of Hf and Al was 3:2. The film thickness was 7 nm. The atmospheric gas during deposition was nitrogen and the pressure was 0.11 Torr. The temperature of the semiconductor body was 220° C. The second insulator was deposited by the pulse laser deposition method. The single target method was used. The target was comprised of strontium, calcium, bismuth, tantalum, and oxygen. Several targets changed in the ratio of composition of elements of strontium and calcium (Sr:Ca=1-x:x) were prepared. The ratio of composition of strontium, calcium, bismuth, and tantalum in the targets was set to Sr:Ca:Bi:Ta=1-x:x:3:2. The thickness y of the second insulator was changed in several ways. The pressure of the atmospheric oxygen gas during deposition was set to 56 mTorr. The temperature of the semiconductor body was 415° C. As the gate electrode conductor, platinum Pt of a thickness of about 200 nm was deposited by electron beam deposition. The heat treatment at the heat treatment step was performed at several temperatures (Z) for 30 minutes at atmospheric pressure in an oxygen atmosphere.

Figure 4:
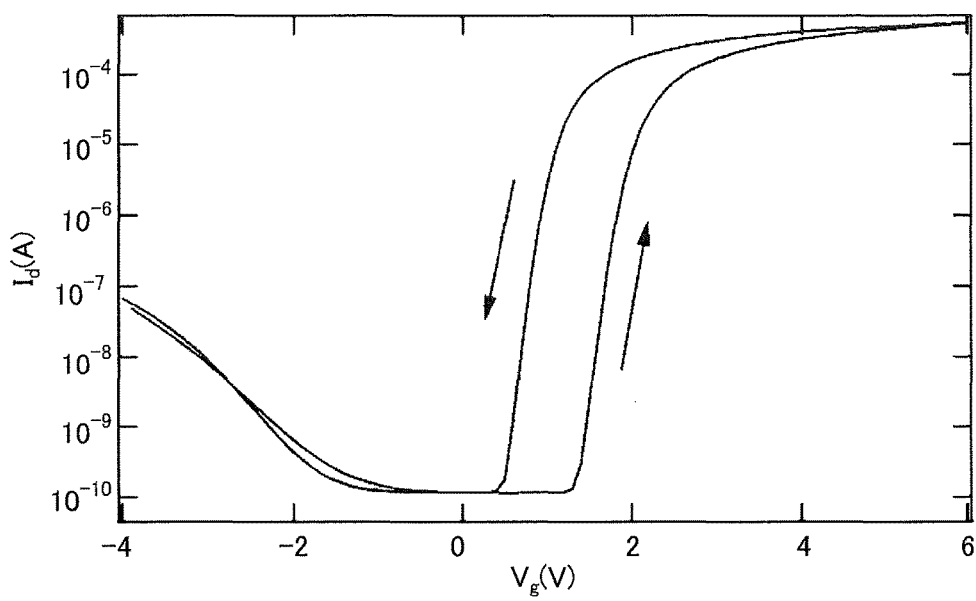
FIG. 4 shows an $I_d$-$V_g$ characteristic of a transistor of Example 1 prepared under conditions of x=0.1, y=200 nm, and Z=800° C.
Figure 5:
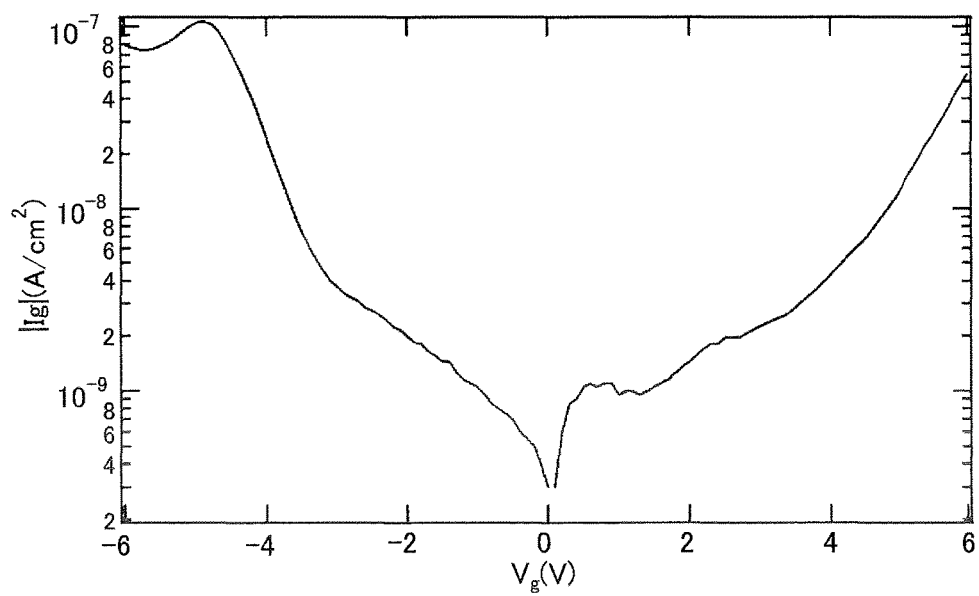
FIG. 5 shows an $I_g$-$V_g$ characteristic of a transistor of Example 1 prepared under conditions of x=0.1, y=200 nm, Z=800° C.
Figure 6:
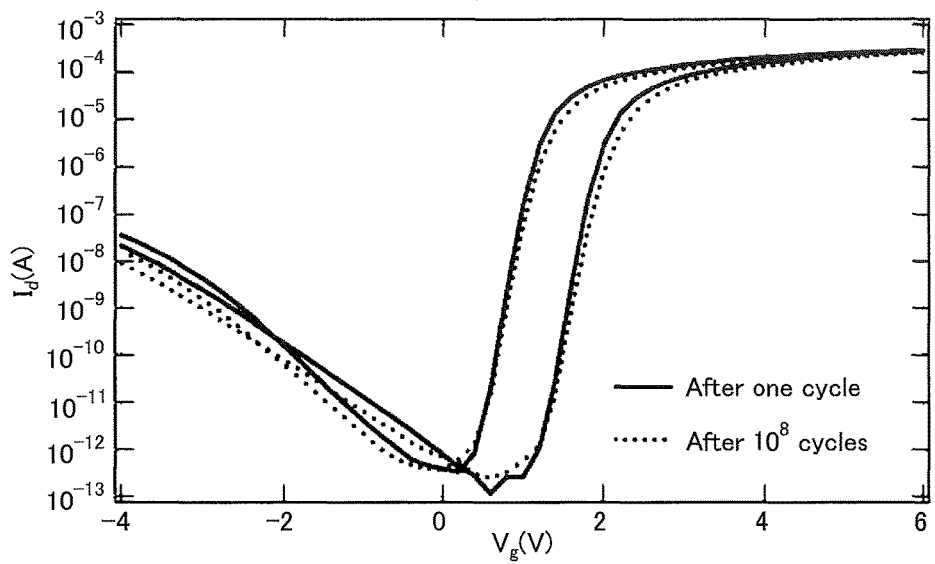
FIG. 6 shows an $I_d$-$V_g$ characteristic of a transistor of Example 1 prepared under conditions of x=0.1, y=200 nm, Z=800° C. after giving one alternate pulse and after giving $10^8$ alternate pulses.
Figure 7:
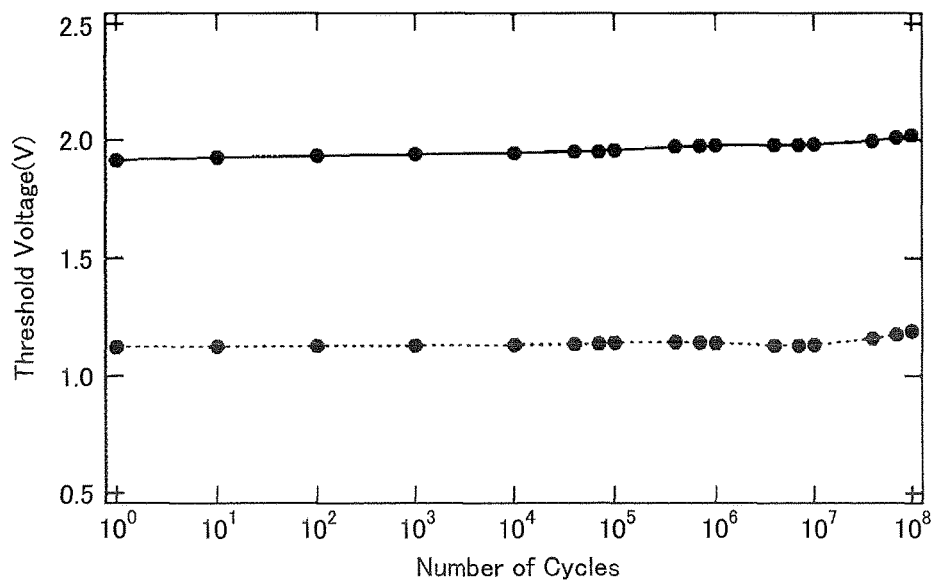
FIG. 7 is a view which shows a relationship between a pulse rewrite endurance property characteristic of a transistor of Example 1 prepared under conditions of x=0.1, y=200 nm, Z=800° C., that is, the threshold voltage of the left and right branches of a hysteresis curve, and the number of repetitions of alternating pulses.
Figure 8:
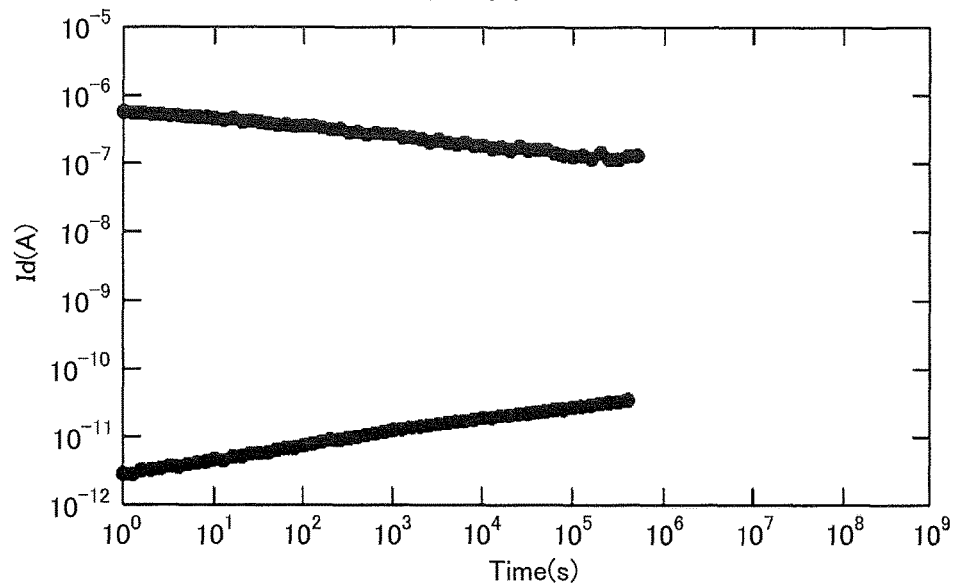
FIG. 8 shows a data retention characteristic of a transistor of Example 1 prepared under conditions of x=0.1, y=200 nm, Z=800° C.

The $I_d$-$V_g$ characteristic of Example 1 which was fabricated under conditions of x=0.1, y=200 nm, Z=800° C. is shown in FIG. 4. The drain electrode was supplied with a drain voltage $V_d$=0.1V and the source electrode and substrate electrode were supplied with a source voltage Vs and substrate voltage $V_{sub}$ under conditions of $V_s$=$V_{sub}$=0V so as to measure this characteristic. As will be understood from the figure, with a reciprocal sweep of the gate voltage between −4V and 6V, hysteresis curves distinctive of an FeFET were seen. The difference between the left and right hysteresis curves, that is, the memory window, was 0.89V. The gate leak current $I_g$-$V_g$ characteristic is shown in FIG. 5. The $V_g$ was swept from 0 to 6V and swept from 0 to −6V to obtain this characteristic. The |$I_g$| of the ordinate of FIG. 5 means the absolute value of $I_g$. The gate electrode was alternately repeatedly given a −4V pulse of pulse width 10 μs and a 6V pulse of pulse width 10 μs, then the $I_d$-$V_g$ characteristic was measured. FIG. 6 shows the $I_d$-$V_g$ characteristic after giving one alternate pulse (broken line) and the $I_d$-$V_g$ characteristic after giving $10^8$ alternate pulses (solid line). The $I_d$-$V_g$ characteristics after other number of pulses are superposed on the curves drawn here and difficult to see, so their description has been omitted. The pulse rewrite endurance property characteristic, which is obtained by plotting the relationship between the threshold voltages of the left and right branches of the hysteresis curves and the number of cycles of repeated application of alternate pulses (Number of Cycles), is shown in FIG. 7. The points of the dot marks connected by the solid line of FIG. 7 show the threshold voltage of the right side branch, while the points of the dot marks connected by the broken line show the threshold voltage of the left side branch. Next, the data retention characteristic will be shown. A 6V pulse of 0.1s was given to the gate electrode, then the data retention mode was entered and the value of the drain current was read at suitable time intervals. At the time of data retention, a retention voltage of 1.2V was given to the gate electrode. At the time of a read operation, further $V_d$ was set to 0.1V to read the $I_d$. The upper side curve of FIG. 8 shows those results. It will be understood that the ON state is held for 1 week or more. A −4V pulse of 0.1s was given to the gate electrode, then the data retention mode was entered and the value of the drain current was read at suitable time intervals. At the time of data retention, a retention voltage of 1.2V was given to the gate electrode. At the time of a read operation, further $V_d$ was set to 0.1V to read the $I_d$. The lower side curve of FIG. 8 shows those results. It will be understood that the OFF state is held for 1 week or more. The ratio of the drain currents in the on state and off state after the elapse of 1 week was three orders of magnitude or more. If drawing extrapolations of the two curves, it is shown that a data retention characteristic on the order of 10-year units is possible.

Figure 9:
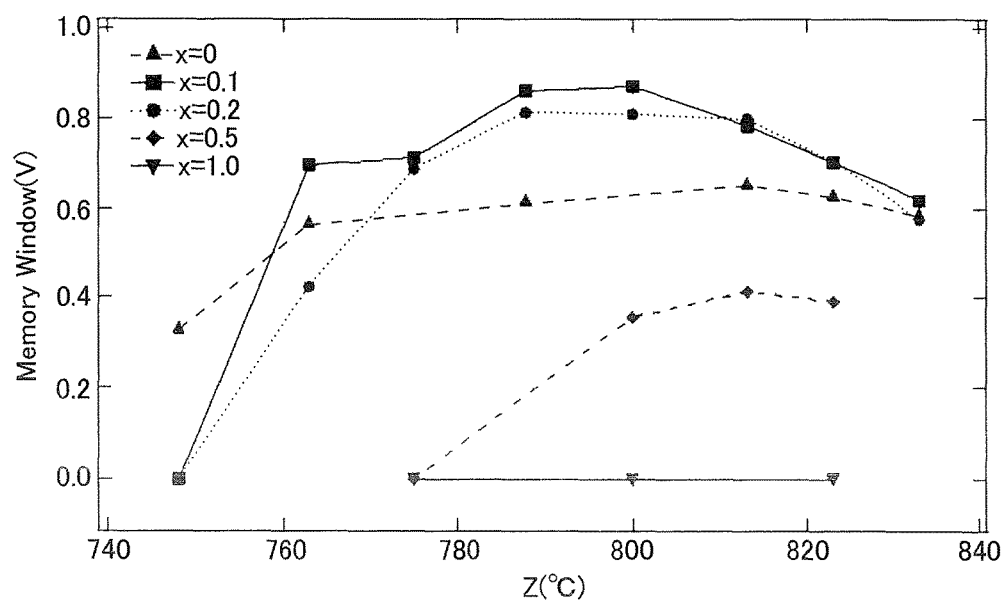
FIG. 9 is a view which shows a relationship of a memory window of a transistor of Example 1 and a heat treatment temperature Z for five types of x.

Five targets of x=0.1, x=0.2, x=0.5 and comparison use x=0 and x=1.0 were prepared and the single target method used under various conditions to fabricate transistors of Example 1 and comparative examples. In FIG. 9, the abscissa indicates the heat treatment temperature Z° C., while the ordinate indicates the memory window which is obtained from the $I_d$-$V_g$ characteristic of the prepared transistors. FIG. 9 shows the results of 748° C. to 833° C. The triangle, square, dot, diamond, and inverted triangle marks respectively show the results of x=0, x=0.1, x=0.2, x=0.5, and x=1.0. Compared with the characteristic of the transistor of x=0 existing in the past, the transistors made from targets of x=0.1 and x=0.2 had much larger memory windows. Further, from FIG. 9, it will be understood that a 760° C. to 833° C. heat treatment temperature is suitable. The result of x=1.0 is the result of $CaBi_2Ta_2O_9$. As will be understood from FIG. 9, the memory window is about 0V. That is, the device does not operate as an FeFET at all. As explained in paragraph [0009], $CaBi_2Ta_2O_9$ is one of the materials where a large Ec is exhibited as an MFM capacitor. As stated at the end of [0009], this is a good example of a case where desktop theory alone is of no use at all and where it is necessary to actually prepare FeFET prototypes and measure and evaluate them for their characteristics in order to reach the invention.

Example 2

Example 2 also relates to the second embodiment (see FIG. 2). A semiconductor body for an n-channel transistor which is formed by a silicon material was used. The material of the first insulator 1 was halfnium-aluminum oxide. The pulse laser deposition method was used. The target was comprised of Hf, Al, and O, and the ratio of composition of Hf and Al was 3:2. The film thickness was 7 nm. At the time of deposition, the atmospheric gas was nitrogen of a pressure of 0.11 Torr. The temperature of the semiconductor body was 220° C. The second insulator 2 was deposited by the pulse laser deposition method. The multiple target method was used and two targets were prepared. The first target was made of strontium, calcium, bismuth, tantalum, and oxygen with a ratio of composition of those elements of Sr:Ca:Bi:Ta=0.5:0.5:3:2, while the second target was comprised of strontium, bismuth, tantalum, and oxygen. The ratio of composition of the elements was Sr:Ca:Bi:Ta=1:0:3:2. The deposition time using the first target was designated as t1, while the deposition time using the second target was designated as t2. In the time of t1+t2, a 10 nm thickness layer was deposited. This process was repeated. t1 and t2 were suitably selected to fabricate a large number of materials with different ratios of composition of elements of strontium and calcium (Sr:Ca=1-x:x).

Figure 10:
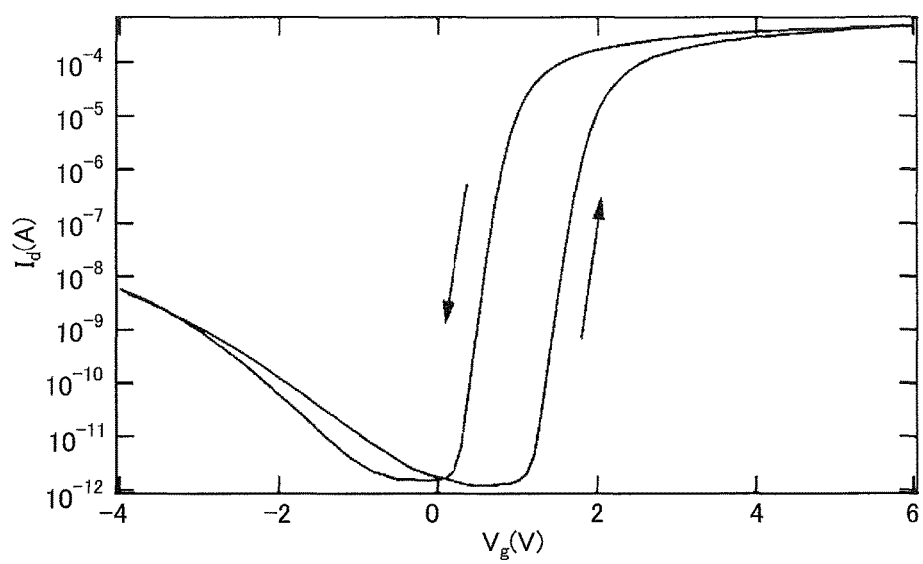
FIG. 10 shows an $I_d$-$V_g$ characteristic of a transistor of Example 2 prepared under conditions of x=0.2, y=200 nm, Z=813° C.
Figure 11:
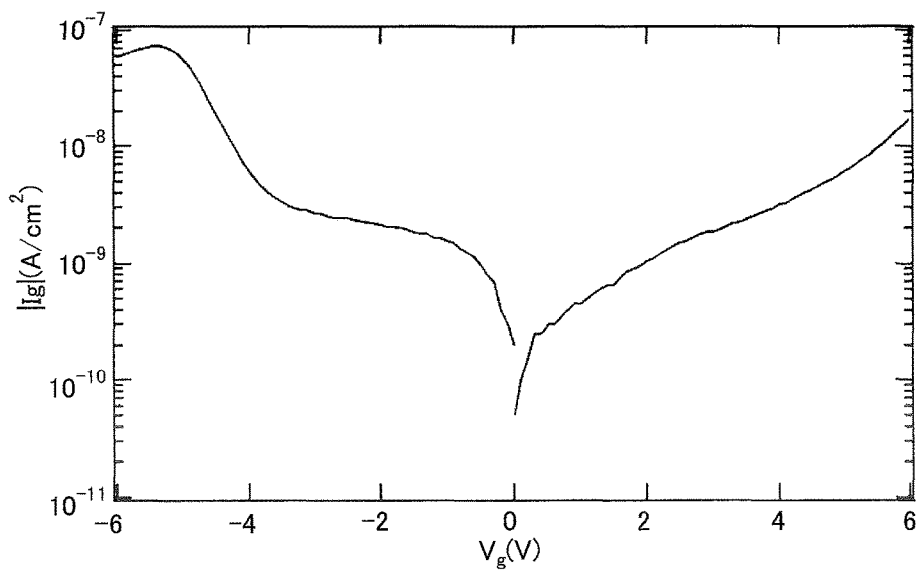
FIG. 11 shows an $I_g$-$V_g$ characteristic of a transistor of Example 2 prepared under conditions of x=0.2, y=200 nm, Z=813° C.
Figure 12:
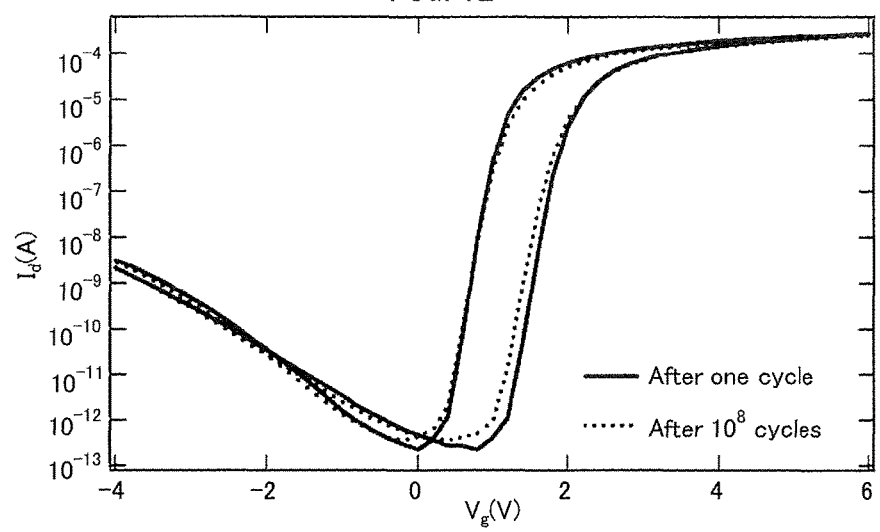
FIG. 12 shows an $I_d$-$V_g$ characteristic of a transistor of Example 2 prepared under conditions of x=0.2, y=200 nm, Z=800° C. after giving alternating pulses one time and after giving alternating pulses $10^8$ times.
Figure 13:
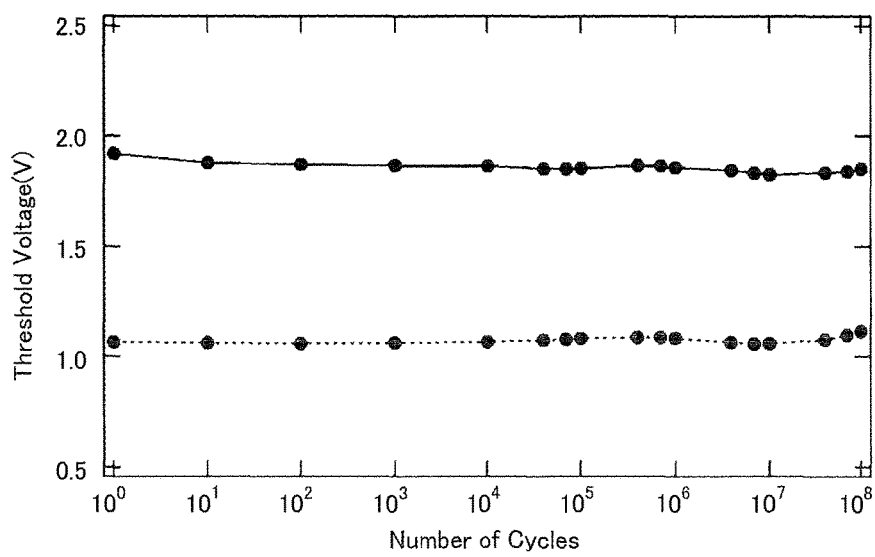
FIG. 13 is a view which shows a relationship between a pulse rewrite endurance property characteristic of a transistor of Example 2 prepared under conditions of x=0.2, y=200 nm, Z=813° C., that is, the threshold voltage of the left and right branches of a hysteresis curve, and the number of repetitions of alternating pulses.
Figure 14:
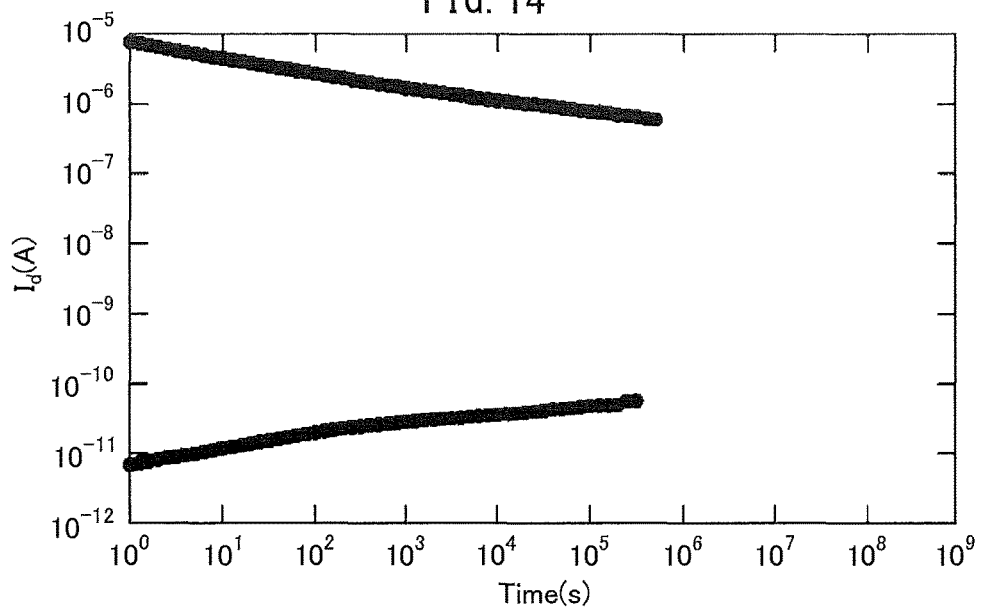
FIG. 14 shows a data retention characteristic of a transistor of Example 1 prepared under conditions of x=0.2, y=200 nm, Z=813° C.

The thickness y of the second insulator was also changed in several ways. The pressure of the atmospheric oxygen gas during deposition of the second insulator was set to 56 mTorr. The temperature of the semiconductor body was 415° C. As the gate electrode conductor, approximately 200 nm thick platinum Pt was deposited by electron beam deposition. The heat treatment of the heat treatment step was performed at several temperatures (Z) for 30 minutes in an atmospheric pressure oxygen atmosphere. The $I_d$-$V_g$ characteristic of the transistor of Example 2 which was fabricated under conditions of x=0.2, y=200 nm, Z=813° C. is shown in FIG. 10. The drain electrode was supplied with a drain voltage $V_d$=0.1V and the source electrode and substrate electrode were supplied with a source voltage Vs and substrate voltage $V_{sub}$ under conditions of $V_s$=$V_{sub}$=0V and the characteristic under this condition was measured. As will be understood from FIG. 10, with a reciprocal sweep of the gate voltage between −4V and 6V, hysteresis curves distinctive to an FeFET were seen. The difference between the left and right hysteresis curves, that is, the memory window, was 0.97V. The gate leak current $I_g$-$V_g$ characteristic is shown in FIG. 11. The $V_g$ was swept from 0 to 6V and swept from 0 to −6V to measure this characteristic. The $I_d$-$V_g$ characteristic measured after alternate repeated application of a pulse width 10 μs and −4V pulse and a pulse width 10 μs and 6V pulse is shown in FIG. 12. The pulse rewrite endurance property characteristic, which is obtained by plotting the relationship between the threshold voltages of the left and right branches of the hysteresis curves and the number of cycles of repeated application of alternate pulses is shown in FIG. 13. Next, the data retention characteristic will be shown. A 6V pulse of 0.1s was given to the gate electrode, then the data retention mode was entered and the value of the drain current was read at suitable time intervals. At the time of data retention, a retention voltage of 1.2V was given to the gate electrode. At the time of a read operation, further Vd was set to 0.1V to read the Id. The upper side curve of FIG. 14 shows those results. It will be understood that the ON state is held for 5.8 days or more. A −4V pulse of 0.1s was given to the gate electrode, then the data retention mode was entered and the value of the drain current was read at suitable time intervals. At the time of data retention, a retention voltage of 1.2V was given to the gate electrode. At the time of a read operation, further $V_d$ was set to 0.1V to read the $I_d$. The lower side curve of FIG. 14 shows those results. It will be understood that the OFF state is held for 3.7 days or more. The ratio of the drain currents in the on state and off state after the elapse of four days was about four orders in magnitude. If drawing extrapolations of the two curves, it is shown that a data retention characteristic on the order of 10-year units is possible.

Figure 15:
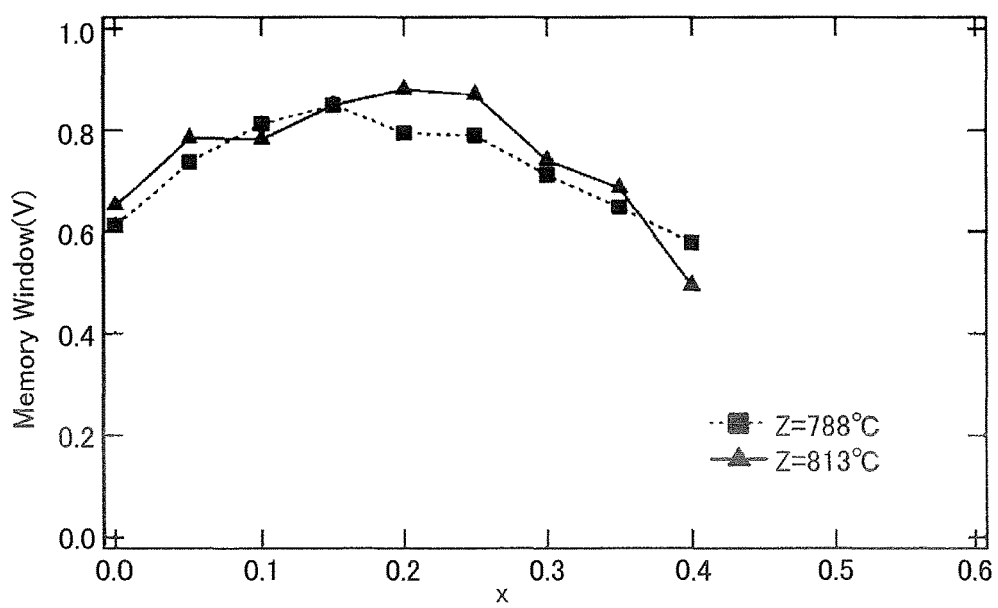
FIG. 15 is a view which shows a relationship of a memory window of a transistor of Example 2 prepared under conditions of Z=788° C. and Z=813° C.

Adjusting the deposition time when using the first target "t1" and the deposition time t2 when using the second target, numerous transistors having different x values were prepared. FIG. 15 shows the results. The abscissa shows x, while the ordinate shows the memory window. The film thickness was y=200 nm. In FIG. 15, the triangle marks show the results of transistors heat treated at Z=813° C., while the square marks show the results at Z=788° C. The results by the single target method of FIG. 9 also fit well over the curve of FIG. 15. With the single target method and with the multiple target method, equally good transistors can be fabricated. The results of x=0 in FIG. 15 are results of the prior art which does not contain calcium. As will be understood from the figure, if even a little calcium is contained, the memory window is larger than the memory window of the transistor of x=0. From FIG. 15, the suitable range of x is a range which is larger than 0 and smaller than 0.4. In other words, it is preferable that the ratio of the calcium element to the strontium element is larger than 0 and not more than two-thirds. More preferably the ratio is larger than 0 and not more than 7/13, most preferably 1/19 to 3/7.

Figure 18:
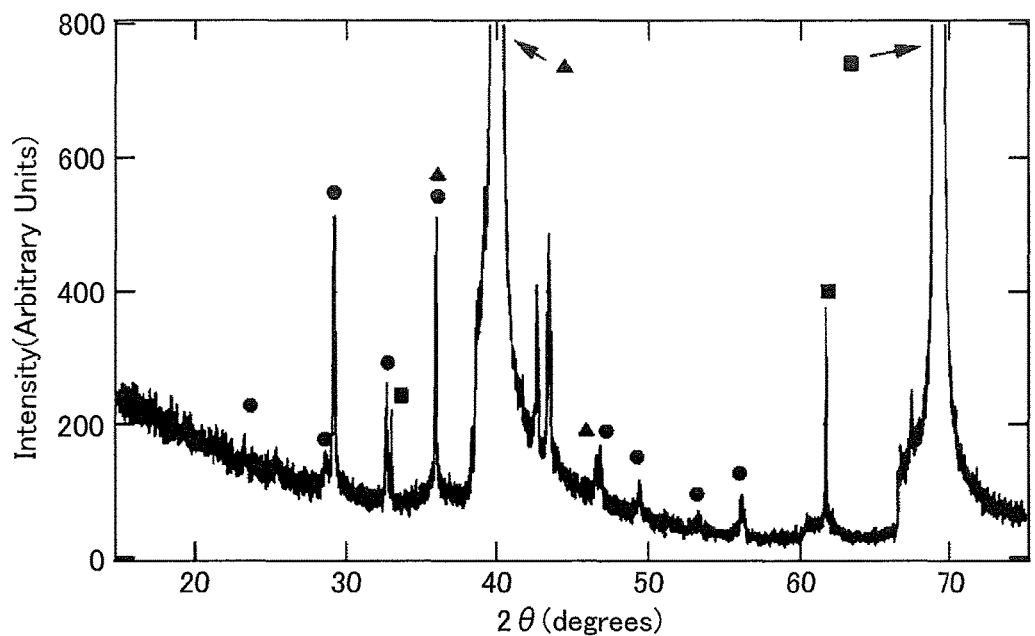
FIG. 18 shows a result of evaluation by x-ray diffraction of an XRD monitor sample corresponding to a transistor of Example 2 of y=160 nm prepared at Z=813° C.

Transistors with a film thickness y of not only 200 nm, but also smaller than that were prepared. FIG. 16 shows the results. The amount of the abscissa indicates y, while the ordinate shows the memory window of the prepared transistor. In FIG. 16, the square marks show the results of a transistor prepared under conditions of x=0.2 and Z=813° C., while the dot marks show the results of a transistor prepared under conditions of x=0.2 and Z=788° C. The triangle marks shows the results of a reference transistor prepared under conditions not containing calcium (x=0) and Z=813° C. As shown in FIG. 16, the memory window of a transistor of y=120 nm in the case of including calcium is comparable with the memory window of a transistor of y=200 nm in the case of not including calcium. The results clearly show that the present invention is useful for fabrication of a transistor with a short gate length. The results of evaluation by x-ray diffraction of the XRD monitor sample corresponding to this transistor of Z=813° C. and y=120 nm are as shown in FIG. 17. The results of the XRD monitor sample corresponding to a transistor of Z=813° C. and y=160 nm are shown in FIG. 18. In FIG. 17 and FIG. 18, the peaks of the dot marks correspond to a bismuth layered perovskite-type crystal structure. With this, it is understood that the main ingredient of the second insulator, that is, the strontium-calcium-bismuth-tantalum oxide, contains a bismuth layered perovskite-type crystal structure. Note that, in the figures, the peaks of the square marks are the peaks corresponding to a crystal structure of a silicon semiconductor body, while the peaks of the triangle marks are peaks corresponding to the crystal structure relating to the gate electrode conductor Pt.

Figure 19:
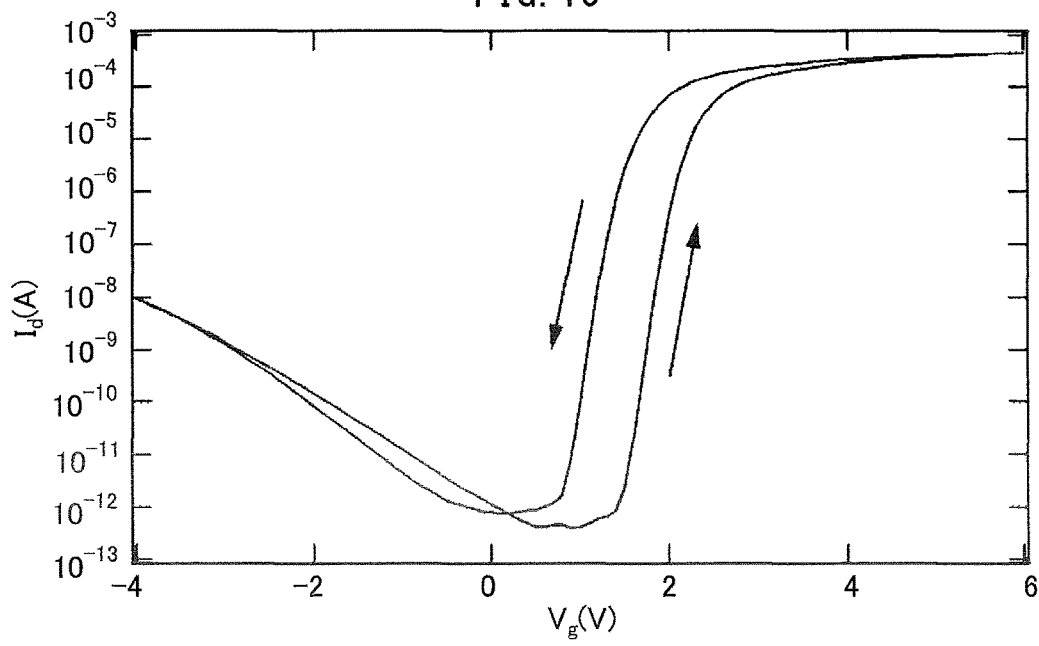
FIG. 19 shows an $I_d$-$V_g$ characteristic of a transistor with a first insulator with a ratio of composition of Hf and Al of 11:9 prepared under conditions of x=0.2, y=200 nm, and Z=813° C.
Figure 20:
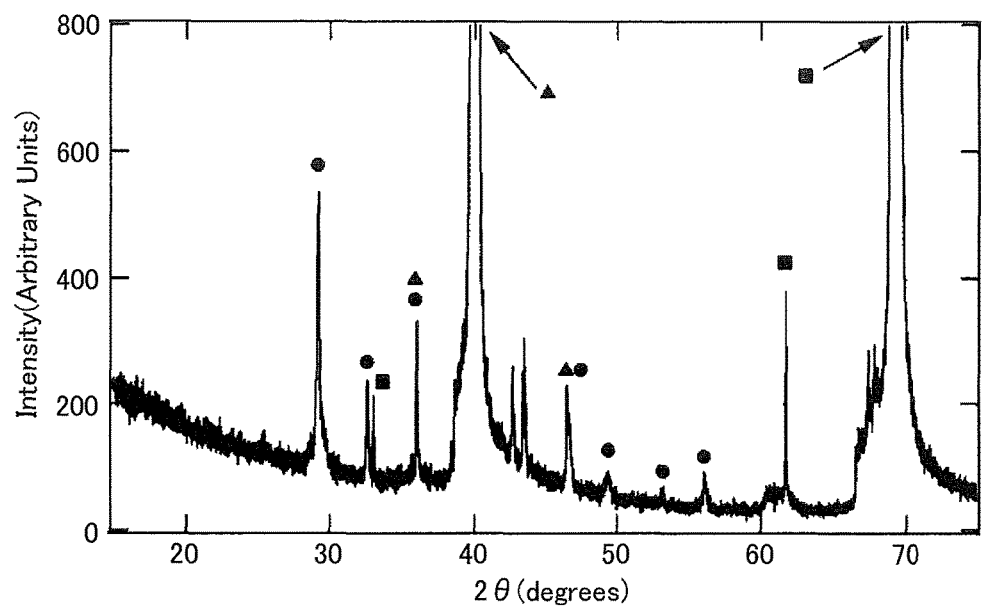
FIG. 20 shows results of evaluation by x-ray diffraction of an XRD monitor sample which is formed with a second insulator by a plurality of targets including a first target with a ratio of composition of elements of Sr:Ca:Bi:Ta=0.8:0.2:3:2 and a second target with a ratio of composition of elements of Sr:Ca:Bi:Ta=1:0:2.8:2.3.
Figure 21:
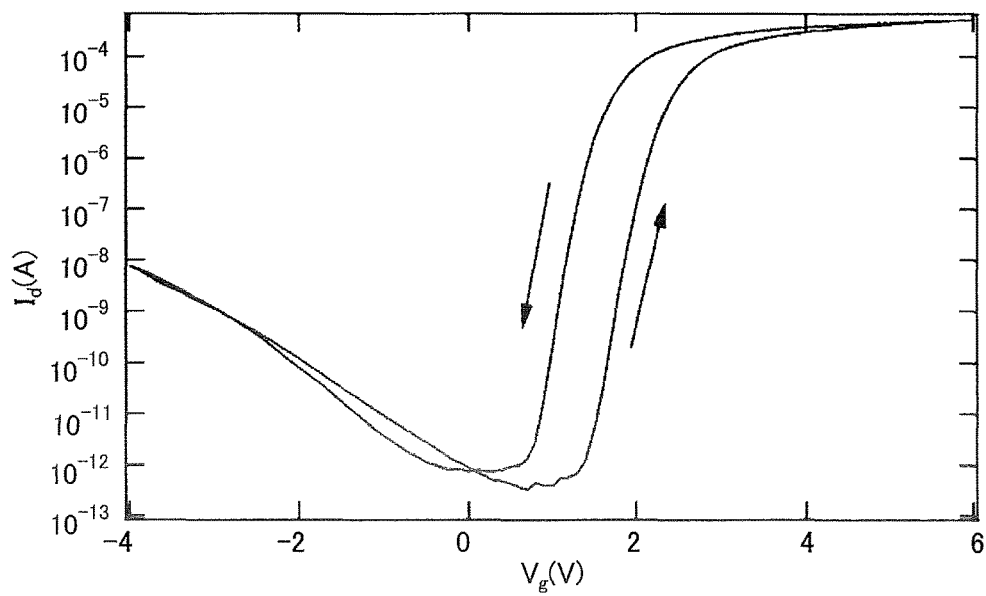
FIG. 21 shows an $I_d$-$V_g$ characteristic of a transistor which is formed with a second insulator by a plurality of targets including a first target with a ratio of composition of elements of Sr:Ca:Bi:Ta=0.8:0.2:3:2 and a second target with a ratio of composition of elements of Sr:Ca:Bi:Ta=1: 0:2.8:2.3.

The composition of the target is not fixed to the above. As an additional example of this example, the results of changing the ratio of composition of the target will also be introduced. The first example is one where the material of the first insulator is a halfnium-aluminum oxide, but the ratio of composition of Hf and Al was made 11:9. The film thickness remained 7 nm. The above multiple target method of two types of targets was used to form second insulator of a x=0.2 and y=200 nm. The gate electrode conductor was platinum with a thickness of 200 nm. Z was 813° C. FIG. 19 shows the results of the $I_d$-$V_g$ characteristic. The second example is one where the material of the first insulator is a halfnium-aluminum oxide with a ratio of composition of Hf and Al returned to 3:2. On the other hand, the first target of the second insulator has a ratio of composition of elements of Sr:Ca:Bi:Ta=0.8:0.2:3:2, while the second target was comprised of strontium, bismuth, tantalum, and oxygen with a ratio of composition of elements of Sr:Ca:Bi:Ta=1:0:2.8: 2.3. The multiple target method was used to form a second insulator and prepare a x=0.1 transistor. The result could be deemed equivalent to fabrication in the case of use of a single target of an average composition of Sr:Ca:Bi:Ta=0.9: 0.1:2.9:2.15. The gate electrode conductor was platinum of a thickness of 200 nm. Z was set to 813° C. The results of evaluation by x-ray diffraction of the XRD monitor sample corresponding to this transistor are shown in FIG. 20. It is learned that the main ingredient of the second insulator, that is, the strontium-calcium-bismuth-tantalum oxide, includes a bismuth layered perovskite-type crystal structure. In the same way as the monitor sample, in the figure, the square mark peaks are peaks corresponding to the crystal structure of the silicon semiconductor body, while the triangle mark peaks are peak corresponding to the crystal structure relating to the gate electrode conductor Pt. FIG. 21 shows the results of the $I_d$-$V_g$ characteristic of this transistor. A memory window of 0.76V was obtained. As shown in FIG. 19 and FIG. 21, the composition of Hf and Al of the first insulator and the composition of Bi and Ta of the second insulator are not fixed.

Example 3

Figure 22:
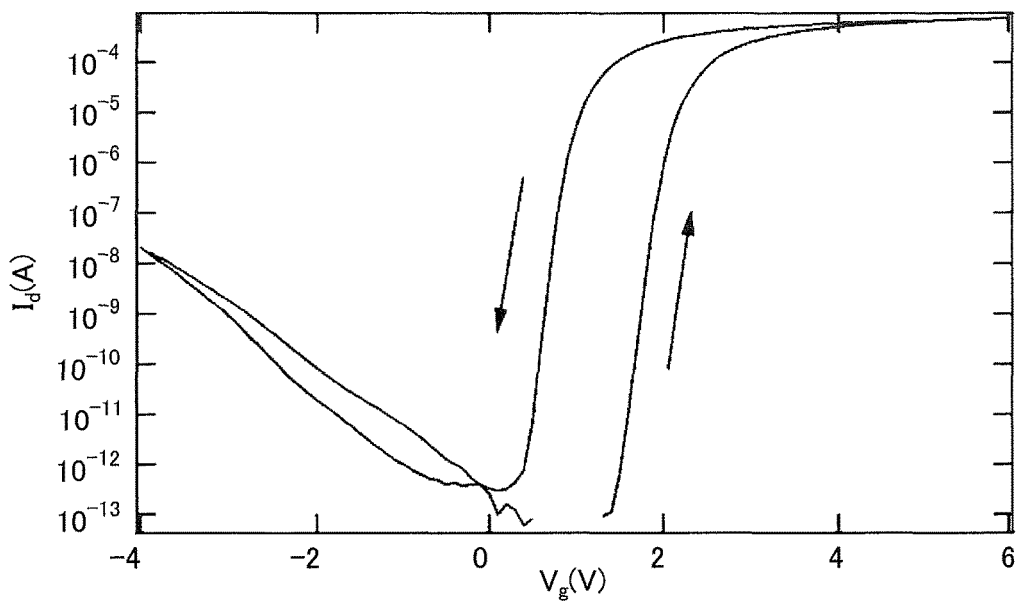
FIG. 22 shows an $I_d$-$V_g$ characteristic of a transistor of a first example of Example 3 where the first insulator is halfnium oxide.
Figure 23:
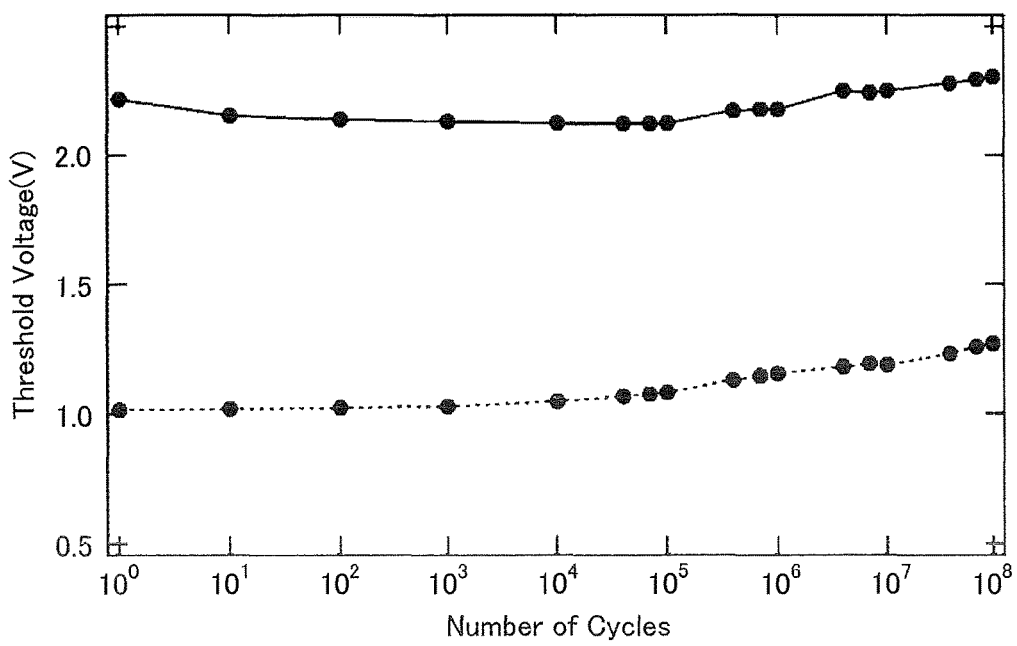
FIG. 23 shows a pulse rewrite endurance property of a transistor of a first example of Example 3 where the first insulator is halfnium oxide.
Figure 24:
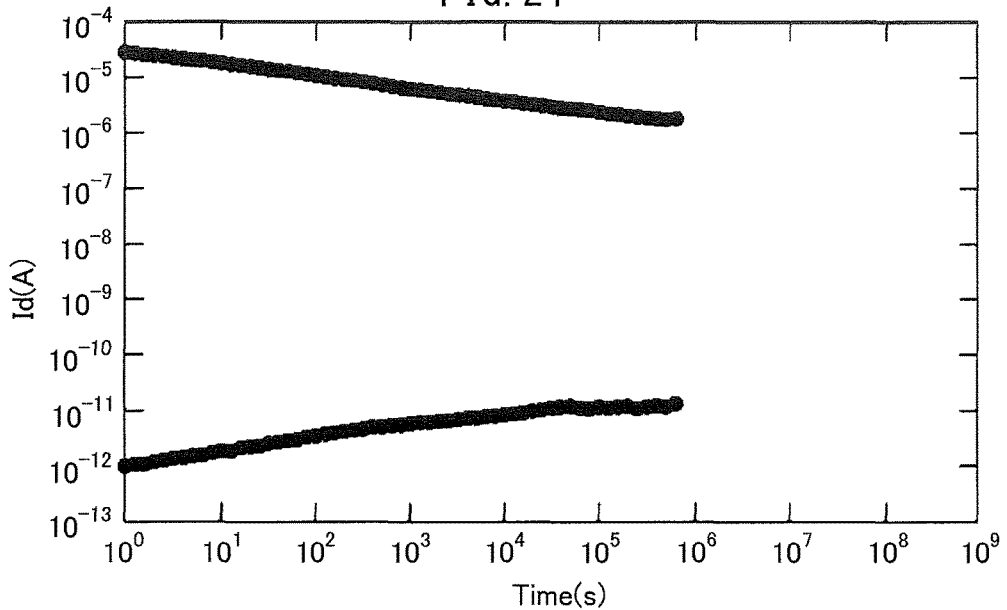
FIG. 24 shows a data retention characteristic of a transistor of a first example of Example 3 where the first insulator is halfnium oxide.
Figure 25:
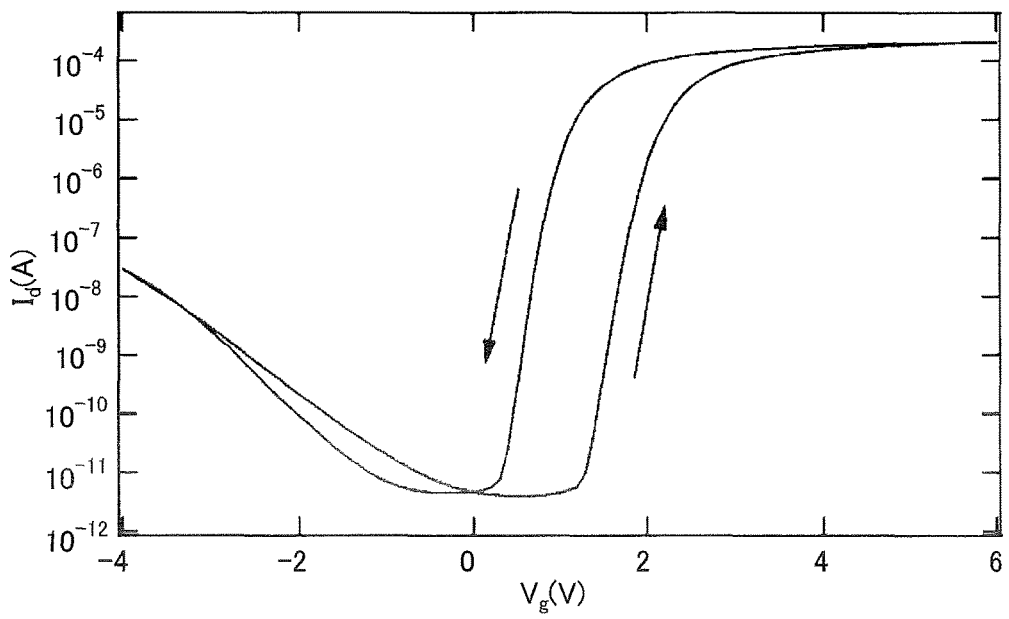
FIG. 25 shows an $I_d$-$V_g$ characteristic of a transistor of a second example of Example 3 where the first insulator is halfnium oxide.
Figure 26:
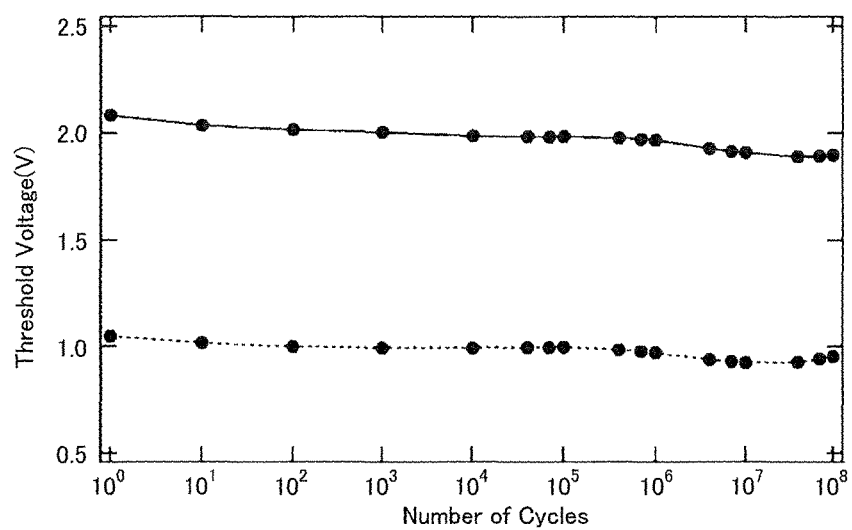
FIG. 26 shows a pulse rewrite endurance property of a transistor of a second example of Example 3 where the first insulator is halfnium oxide.
Figure 27:
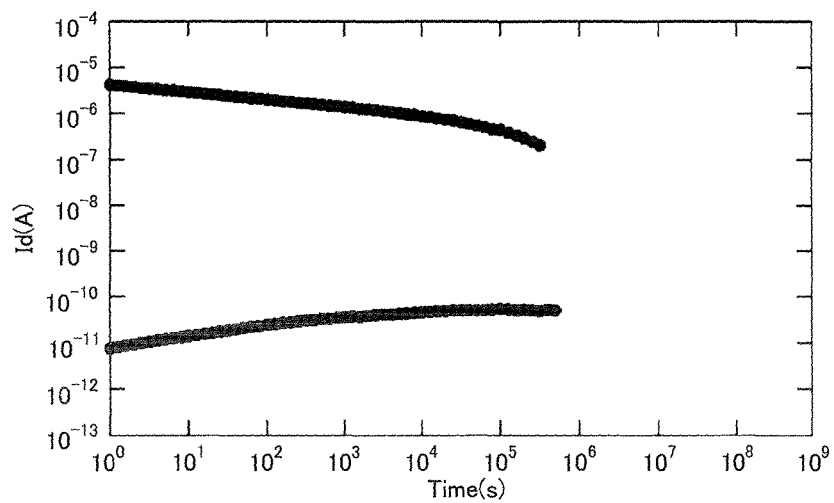
FIG. 27 shows a data retention characteristic of a transistor of a second example of Example 3 where the first insulator is halfnium oxide.
Figure 28:
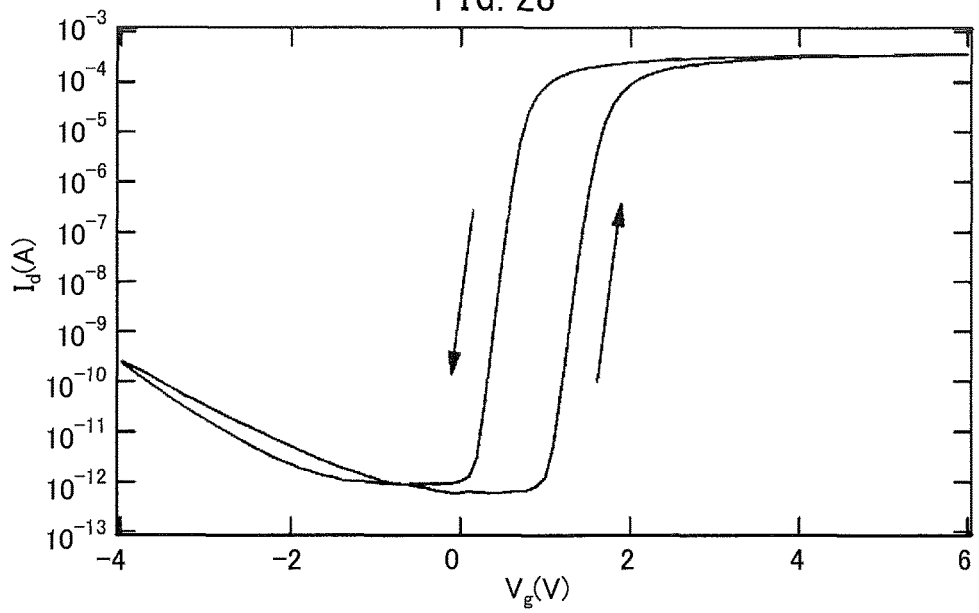
FIG. 28 shows an $I_d$-$V_g$ characteristic of a transistor of a third example of Example 3 where the first insulator is SrTiO$_3$.
Figure 29:
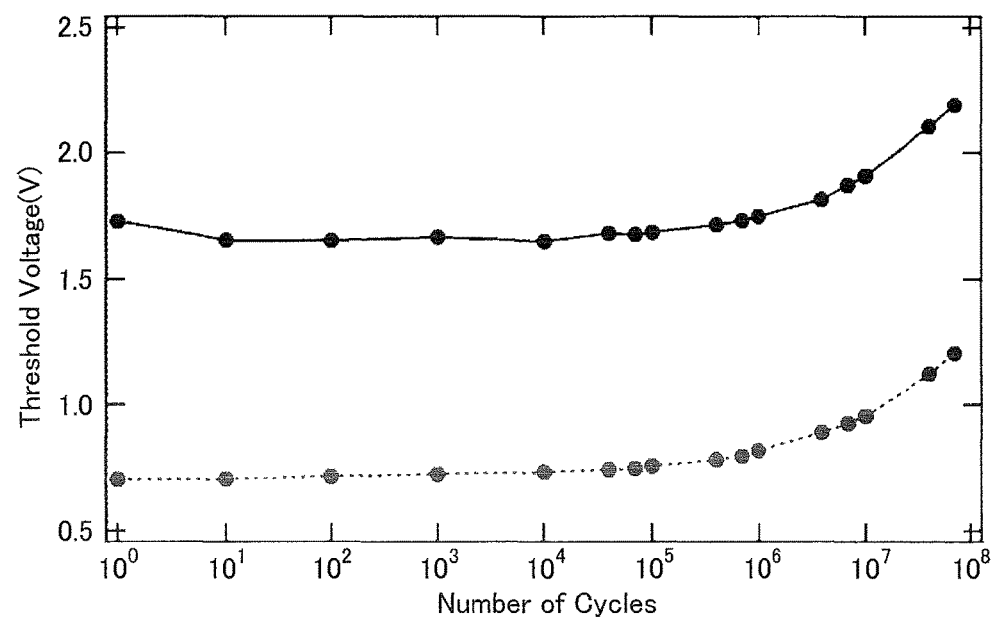
FIG. 29 shows a pulse rewrite endurance property of a transistor of a third example of Example 3 where the first insulator is SrTiO$_3$.
Figure 30:
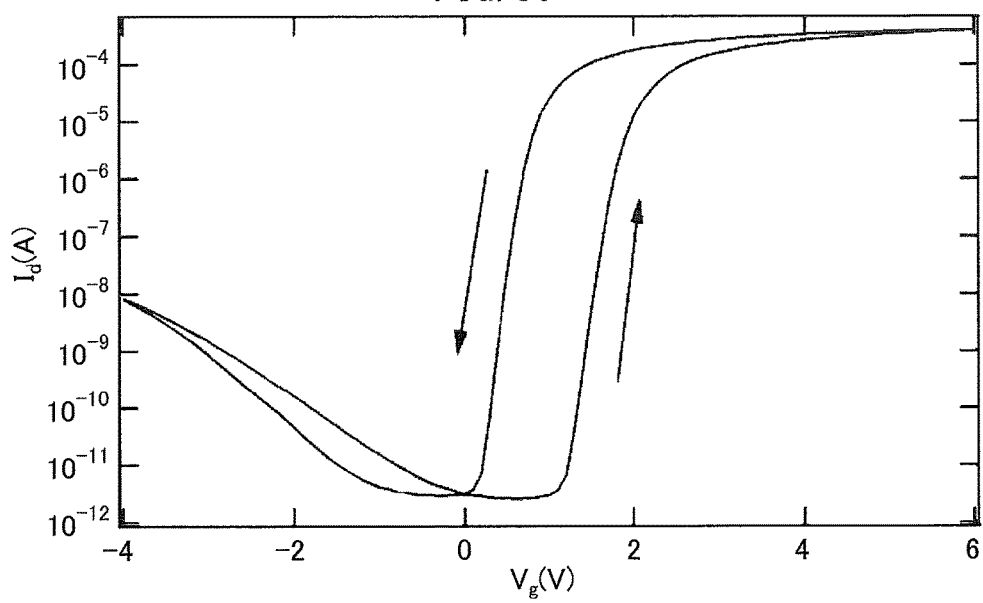
FIG. 30 shows an $I_d$-$V_g$ characteristic of a transistor of a fourth example of Example 3 where the first insulator is a film stack of halfnium-aluminum oxide and SrTiO$_3$.
Figure 31:
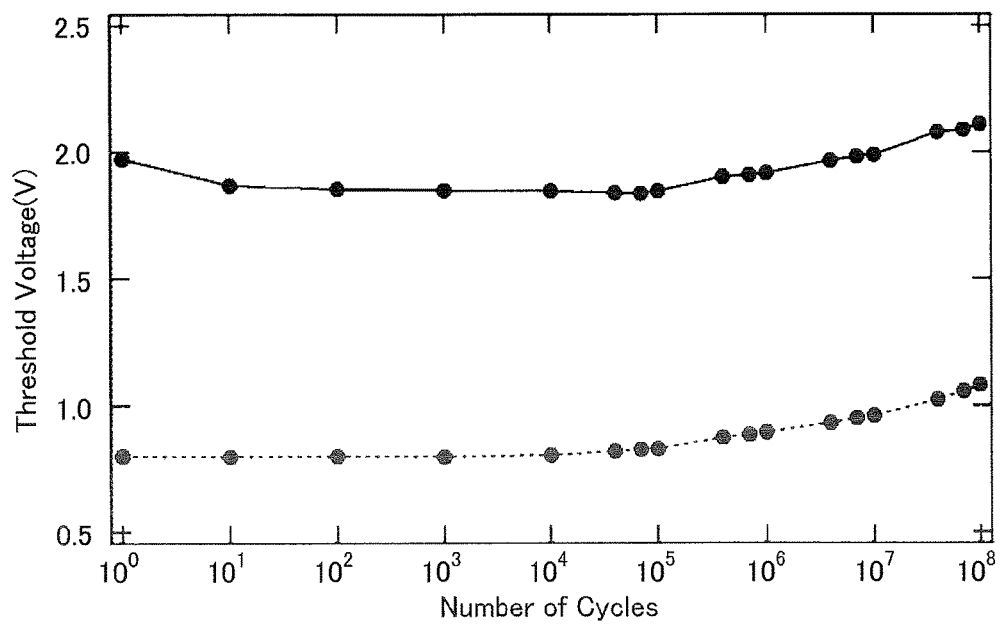
FIG. 31 shows a pulse rewrite endurance property of a transistor of a fourth example of Example 3 where the first insulator is a film stack of halfnium-aluminum oxide and SrTiO$_3$.
Figure 32:
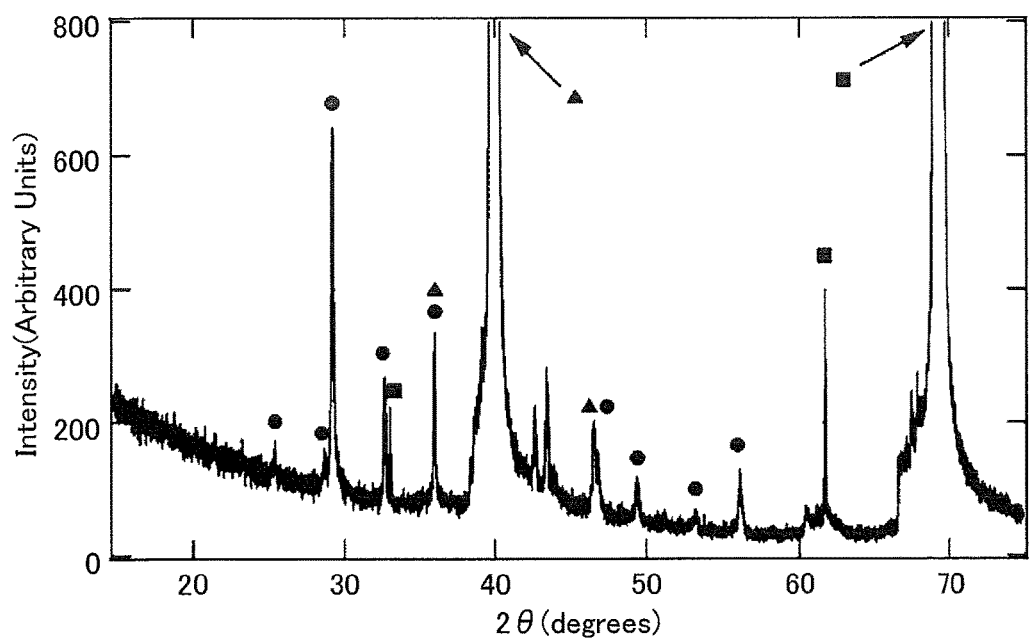
FIG. 32 shows the value of XRD evaluation of an XRD monitor sample corresponding to a first example of Example 3.
Figure 33:
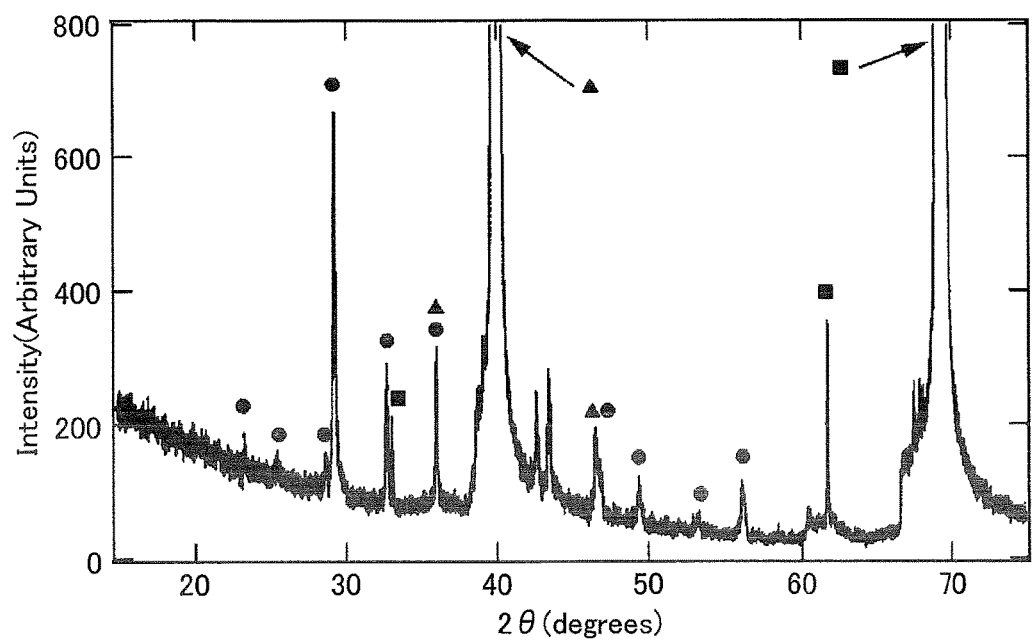
FIG. 33 shows the value of XRD evaluation of an XRD monitor sample corresponding to a second example of Example 3.
Figure 34:
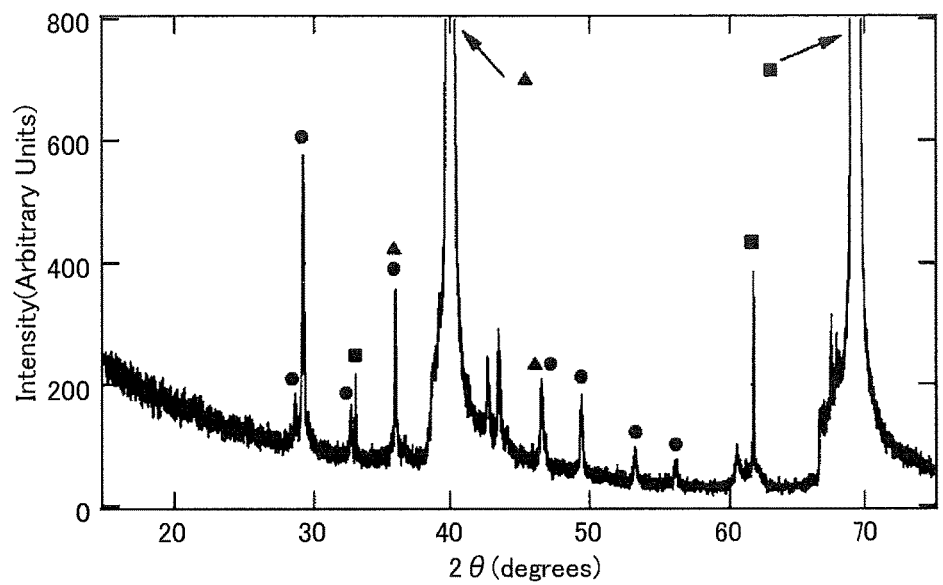
FIG. 34 shows the value of XRD evaluation of an XRD monitor sample corresponding to a third example of Example 3.
Figure 35:
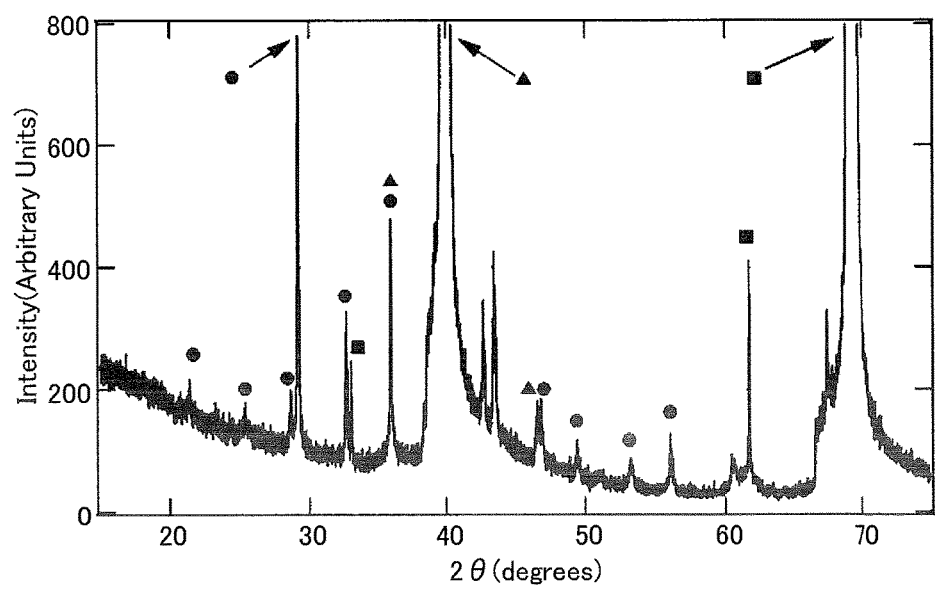
FIG. 35 shows the value of XRD evaluation of an XRD monitor sample corresponding to a fourth example of Example 3.

Example 3 also relates to the second embodiment (see FIG. 2). A semiconductor body for an n-channel transistor which is formed by a silicon material was used. In Example 1 and Example 2, the first insulator was comprised of halfnium-aluminum oxide, but in this example, various materials were used as the material of the first insulator. Instead, the conditions for formation of the second insulator were fixed. That is, in the single target method, x=0.2 and a target of a ratio of composition of elements Sr:Ca:Bi:Ta=0.8: 0.2:3:2 was used. y was 200 nm. The gate electrode conductor was platinum of a thickness of 200 nm. In the first example, the target of the first insulator was made of halfnia (halfnium oxide). This was deposited to 7 nm by the pulse laser deposition method. The atmospheric gas during deposition was oxygen and the pressure was 0.063 Torr. The temperature of the semiconductor body was set to 220° C. The temperature of the heat treatment step was set to Z=788° C. In the second example as well, the target of the first insulator was made of halfnia. This was deposited to 7 nm by the pulse laser deposition method. The atmospheric gas during deposition was nitrogen and the pressure was set to 0.11 Torr. The temperature of the semiconductor body was made 220° C. Z was made 788° C. In the third example, the target of the first insulator was made $SrTiO_3$. This was deposited to 12 nm by the pulse laser deposition method. During deposition, the atmospheric gas was oxygen of a pressure of 0.056 Torr. The temperature of the semiconductor body was set to 415° C. Z was set to 813° C. In the fourth example, the first insulator was set to a multiplayer film of halfnium-aluminum oxide and $SrTiO_3$. First, halfnium-aluminum oxide was deposited, then $SrTiO_3$ was deposited. The ratio of composition of Hf and Al of the halfnium-aluminum oxide target was set to 3:2. The film thickness was 7 nm. During deposition, the atmospheric gas was nitrogen of a pressure of 0.11 Torr. The temperature of the semiconductor body was 220° C. The film thickness of $SrTiO_3$ was 13 nm. During deposition, the atmospheric gas was oxygen of a pressure of 0.08 Torr. During deposition of $SrTiO_3$, the temperature of the semiconductor body was set to 775° C. Z was made 813° C. The results of the $I_d$-$V_g$ characteristic, pulse rewrite endurance property, and data retention characteristic for the transistor of the first example are respectively shown in FIG. 22, FIG. 23, and FIG. 24. The results of the $I_d$-$V_g$ characteristic, pulse rewrite endurance property, and data retention characteristic for the transistor of the second example are respectively shown in FIG. 25, FIG. 26, and FIG. 27. The results of the $I_d$-$V_g$ characteristic and pulse rewrite endurance property for the transistor of the third example are respectively shown in FIG. 28 and FIG. 29. The results of the $I_d$-$V_g$ characteristic and pulse rewrite endurance property for the transistor of the fourth example are respectively shown in FIG. 30 and FIG. 31. The memory windows of the first, second, third, and fourth transistors are respectively 1.12V, 1.01V, 0.90V, and 1.08V, and are larger than the memory window of the reference transistor of which second insulator is formed of an oxide of strontium, bismuth, and tantalum not containing calcium shown in FIG. 9 or FIG. 15. The results of XRD evaluation of XRD monitor samples corresponding to the first example to fourth example are shown in FIG. 32 to FIG. 35. In these figures, a bismuth layered perovskite crystal structure could be confirmed.

Example 4

Figure 36:
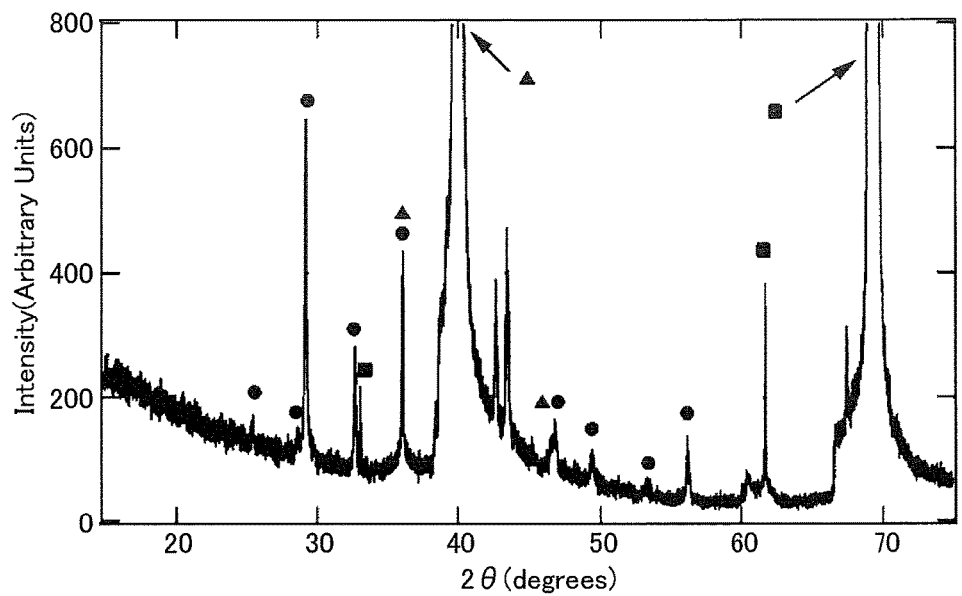
FIG. 36 shows the results of XRD evaluation of an XRD monitor sample corresponding to a transistor of a first embodiment of the present invention.
Figure 37:
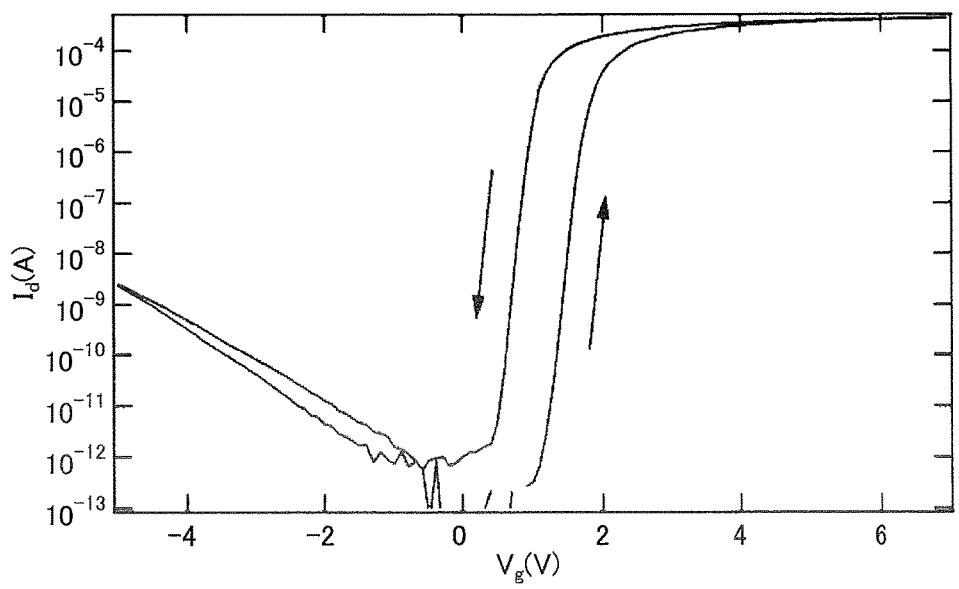
FIG. 37 shows an $I_g$-$V_g$ characteristic of an example of a transistor of a first embodiment of the present invention.
Figure 38:
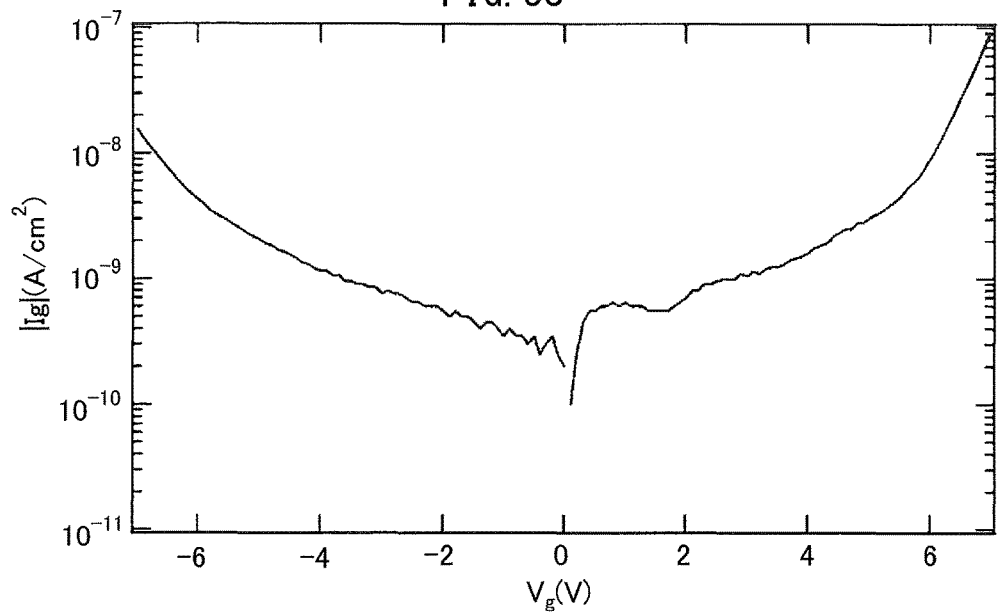
FIG. 38 shows an $I_d$-$V_g$ characteristic of an example of a transistor of a first embodiment of the present invention.
Figure 39:
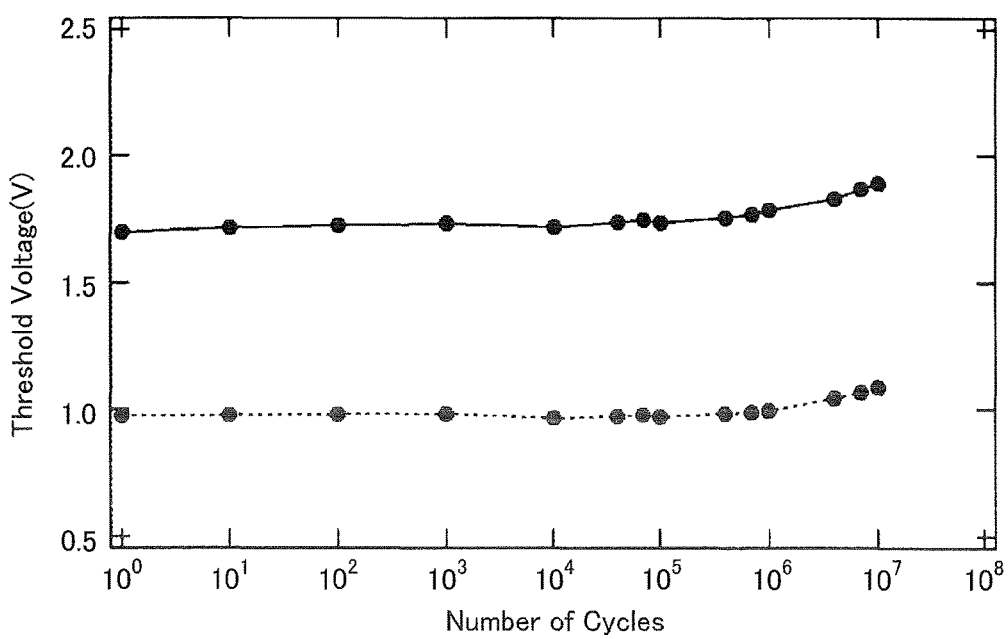
FIG. 39 shows a pulse rewrite endurance property of an example of a transistor of a first embodiment of the present invention.

Example 4 relates to the first embodiment (see FIG. 1). Here, as the semiconductor body 10, a p-type semiconductor body which has an n-type source region and an n-type drain region was used. A buffer hydrofluoric acid was used to remove the residual oxide layer at the surface, then an insulator 11 comprised of a strontium-calcium-bismuth-tantalum oxide was formed. The multiple target method was used to form the insulator 11. Two targets were used. The first target was comprised of strontium, calcium, bismuth, tantalum, and oxygen in a ratio of composition of elements of Sr:Ca:Bi:Ta=0.5:0.5:3:2, while the second target was comprised of strontium, bismuth, tantalum, and oxygen in a ratio of composition of elements of Sr:Ca:Bi:Ta=1:0:3:2. The deposition of the first target and the deposition of the second target were performed consecutively to deposit a 10 nm thick layer and this process was repeated. The thickness of the insulator 11 was 200 nm. The x of the ratio of composition of elements of strontium and calcium (Sr: Ca=1-x:x) was 0.2. The temperature of the semiconductor body during deposition by the laser deposition method was 415° C., while the pressure of the oxygen gas atmosphere was 56 mTorr. For the gate electrode conductor, 200 nm thick platinum Pt was deposited by electron beam deposition. As the gate electrode conductor, approximately 200 nm thick platinum Pt was deposited by electron beam deposition. The heat treatment in the heat treatment step was performed at 813° C. for 30 minutes at atmospheric pressure in an oxygen atmosphere. FIG. 36 shows the results of XRD evaluation of a corresponding XRD monitor sample. A bismuth layered perovskite crystal structure can be confirmed. FIG. 37 shows the $I_d$-$V_g$ characteristic when sweeping the gate voltage from −5V to 7V, FIG. 38 shows the $I_g$-$V_g$ characteristic when changing the gate voltage from 0V to 7V and further changing the gate voltage from 0V to −7V, and FIG. 39 shows the results of pulse rewrite endurance property.

Example 5

Figure 40:
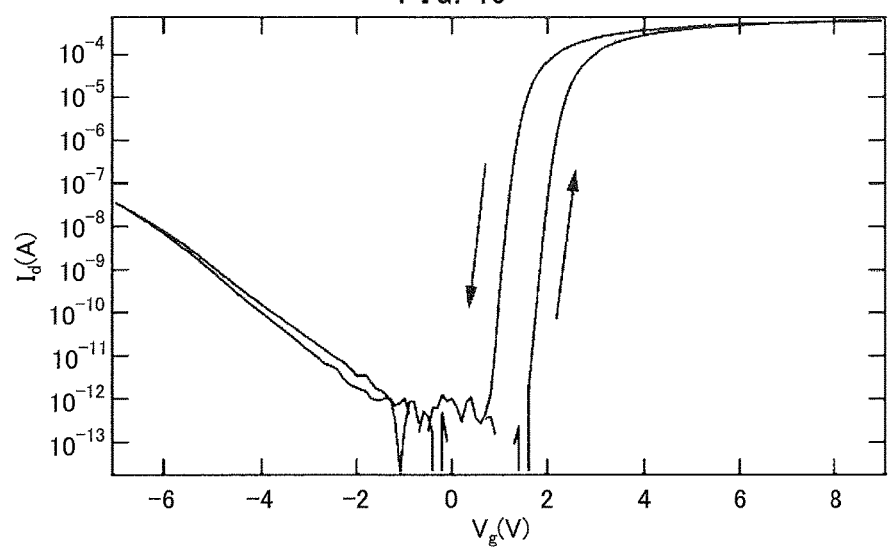
FIG. 40 shows an $I_d$-$V_g$ characteristic of a transistor of a first example of Example 5.
Figure 41:
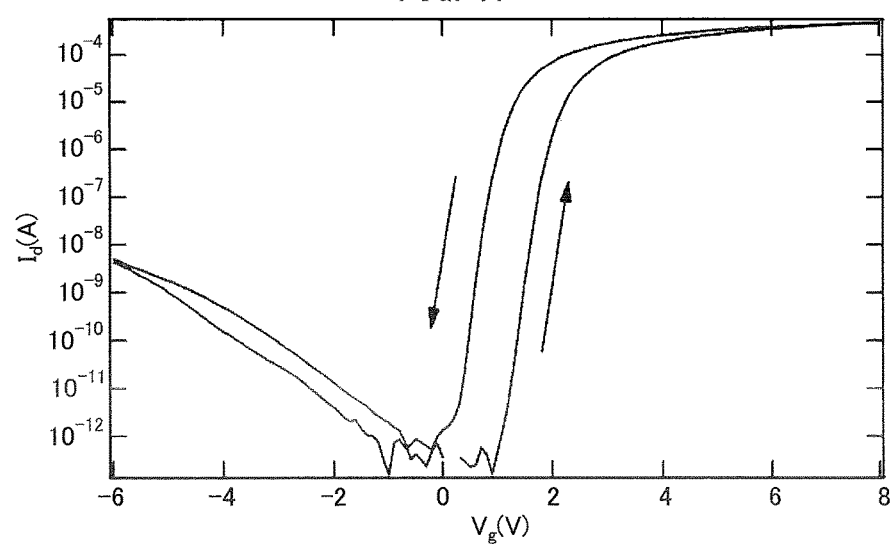
FIG. 41 shows an $I_d$-$V_g$ characteristic of a transistor of a second example of Example 5.

Example 5 relates to the third embodiment (see FIG. 3). A semiconductor body for an n-channel transistor which was made of a silicon material was used. In the first example, halfnia (halfnium oxide) was used as the target of the first insulator. This was deposited to 7 nm by the pulse laser deposition method. During the deposition, the atmospheric gas was oxygen of a pressure of 0.063 Torr. The temperature of the semiconductor body was set to 220° C. Regarding the conditions for formation of the second insulator, the single target method was performed at x=0.2 using a target of a ratio of composition of elements Sr:Ca:Bi:Ta=0.8:0.2:3:2. y is 200 nm. As the target of the third insulator, halfnia (halfnium oxide) was used. This was deposited to 25 nm by the pulse laser deposition method. During the deposition, the atmospheric gas was oxygen of a pressure of 0.063 Torr. The temperature of the semiconductor body was set to 220° C. As the gate electrode conductor, approximately 200 nm thick platinum Pt was deposited by electron beam deposition. The heat treatment was performed at 788° C. for 30 minutes at atmospheric pressure in an oxygen atmosphere. In the second example, halfnia (halfnium oxide) was used as the target of the first insulator. This was deposited to 7 nm by the pulse laser deposition method. During the deposition, the atmospheric gas was nitrogen of a pressure of 0.11 Torr. The temperature of the semiconductor body was set to 220° C. Regarding the conditions for formation of the second insulator, the single target method was used using a target of x=0.2 with ratio of composition of elements of Sr:Ca:Bi:Ta=0.8:0.2:3:2. y was 200 nm. As the target of the third insulator, halfnia (halfnium oxide) was used. This was deposited to 25 nm by the pulse laser deposition method. The atmospheric gas during deposition was nitrogen of a pressure of 0.11 Torr. The temperature of the semiconductor body was set to 220° C. As the gate electrode conductor, approximately 200 nm thick platinum Pt was deposited by electron beam deposition. The heat treatment was performed at 813° C. for 30 minutes at atmospheric pressure in an oxygen atmosphere. FIG. 40 shows the $I_d$-$V_g$ characteristic of the first example, while FIG. 41 shows the results of measurement of the $I_d$-$V_g$ characteristic of the second example. Since the third insulator is included in this example, a larger gate voltage is necessary compared with the case where the third insulator is not included, but in the first example, a memory window of 0.81V was obtained by a sweep of the gate voltage between −7V and 9V, while in the second example, a memory window of 0.92V was obtained by a sweep of the gate voltage between −6V and 8V. These are ranges of voltage before the later explained phenomena of other physical mechanisms occur and ranges of application of gate voltage where operation as an FeFET is guaranteed. These memory windows are broader than the memory window of an FeFET which does not contain Ca used as a reference.

Above, preferable examples were explained, but some supplemental explanations will be added to these. As the first point, although data of n-channel FeFETs was explained in the examples, exactly the same explanations apply to p-channel FeFETs. The polarities of the gate voltage and drain current may also be considered reversed. As the second point, there are limits to increasing the absolute value of the $V_g$ applied to increase the memory window. It is true that with a certain range of $V_g$, if increasing the positive voltage which is applied to the gate, the left side curve of the $I_d$-$V_g$ curve shifts further to the left, while if increasing the absolute value of the negative voltage which is applied to the gate, the right side curve of the $I_d$-$V_g$ curve shifts further to the right, so the memory window becomes broader. However, if further increasing the absolute value of the $V_g$ which is applied, the direction of the above shift starts to invert. This means that storage phenomena of physical mechanisms such as movement or capture of charged particles different from inversion of polarization of the ferroelectric occurs between the semiconductor and ferroelectric or between the gate conductor and ferroelectric. The data serving as the grounds for discussion of the memory window in the above examples etc. was obtained under conditions of application of a $V_g$ in a range in which phenomena of physical mechanisms such as movement or capture of these charged particles do not appear. As the third point, at the time of measurement of the data retention characteristic, the gate is sometimes given the retention voltage to correct the bias of the threshold voltage, but the threshold voltage can be suitably adjusted by changing the concentration of impurities of the channels of the semiconductor body. Therefore, application of a retention voltage at the time of measurement of the data retention characteristic in the present invention does not affect the characteristics as a nonvolatile memory.

REFERENCE SIGNS LIST 1 first insulator in insulator 11
2 second insulator in insulator 11
3 third insulator in insulator 11
4 gate electrode conductor
10 semiconductor body
11 insulator
12 source region in semiconductor body
13 drain region in semiconductor body

The invention claimed is:

1. A semiconductor ferroelectric memory transistor comprising a semiconductor body which has a source region and a drain region on which an insulator and a gate electrode conductor are stacked in that order,
    wherein the insulator includes a ferroelectric insulator comprising an oxide of strontium, calcium, bismuth, and tantalum, and the oxide of strontium, calcium, bismuth, and tantalum is represented by Sr-Ca-Bi-Ta-O, and
    wherein in the Sr-Ca-Bi-Ta-O, a ratio of the calcium element to the strontium element is larger than 0 and not more than two-thirds.

2. The semiconductor ferroelectric memory transistor according to claim 1,
    wherein the insulator is comprised of a first insulator and a second insulator stacked on the body in that order, and
    wherein the second insulator is the ferroelectric insulator comprising an oxide of strontium, calcium, bismuth, and tantalum, and the oxide of strontium, calcium, bismuth represented by the Sr-Ca-Bi-Ta-O.

3. The semiconductor ferroelectric memory transistor according to claim 2, wherein the oxide of strontium, calcium, bismuth, and tantalum, which is Sr-Ca-Bi-Ta-O has a bismuth layered perovskite-type crystal structure.

4. The semiconductor ferroelectric memory transistor according to claim 3, wherein the insulator has a film thickness of 250 nm or less.

5. The semiconductor ferroelectric memory transistor according to claim 3, wherein the first insulator has a film thickness of 15 nm or less.

6. The semiconductor ferroelectric memory transistor according to claim 2, wherein the first insulator is an oxide of hafnium, an oxide of hafnium and aluminum, an oxide which includes hafnium, an oxide of strontium and titanium, a composite oxide of two or more of any of these, or an oxide layer stack of two or more of any of these.

7. The semiconductor ferroelectric memory transistor according to claim 6, wherein the insulator has a film thickness of 250 nm or less.

8. The semiconductor ferroelectric memory transistor according to claim 6, wherein the first insulator has a film thickness of 15 nm or less.

9. The semiconductor ferroelectric memory transistor according to claim 2, wherein the insulator has a film thickness of 250 nm or less.

10. The semiconductor ferroelectric memory transistor according to claim 2, wherein the first insulator has a film thickness of 15 nm or less.

11. The semiconductor ferroelectric memory transistor according to claim 1, wherein the oxide of strontium, calcium, bismuth, and tantalum, which is Sr-Ca-Bi-Ta-O, has a bismuth layered perovskite-type crystal structure.

12. The semiconductor ferroelectric memory transistor according to claim 11, wherein the insulator has a film thickness of 250 nm or less.

13. The semiconductor ferroelectric memory transistor according to claim 1, wherein the insulator has a film thickness of 250 nm or less.

14. A method of producing a semiconductor ferroelectric memory transistor according to claim 1, the method comprising:
cleaning a semiconductor body surface;
depositing an insulator;
forming a gate electrode conductor; and
providing a heat treatment;
wherein the semiconductor ferroelectric memory transistor includes the semiconductor body having a source region and a drain region on which the insulator including the ferroelectric insulator comprising an oxide of strontium, calcium, bismuth, and tantalum represented by the Sr-Ca-Bi-Ta-O and a gate electrode conductor are stacked in that order.

15. The method according to claim 14, wherein the heat treatment has a temperature of 760° C. to 833° C.

16. The method according to claim 14, wherein the insulator deposition step includes depositing the ferroelectric insulator comprised of an oxide of strontium, calcium, bismuth, and tantalum represented by the Sr-Ca-Bi-Ta-O via pulse laser deposition or sputtering using a plurality of oxide targets with different ratios of composition of strontium, calcium, bismuth, and tantalum.

17. A semiconductor ferroelectric memory transistor comprising a semiconductor body which has a source region and a drain region on which an insulator and a gate electrode conductor are stacked in that order, wherein the insulator comprises a ferroelectric insulator comprising an oxide of strontium, calcium, bismuth, and tantalum, and the oxide of strontium, calcium, bismuth, and tantalum is represented by Sr-Ca-Bi-Ta-O.

18. The semiconductor ferroelectric memory transistor according to claim 17, wherein a ratio of the calcium element to the strontium element in the Sr-Ca-Bi-Ta-O is larger than 0 and not more than two-thirds.

19. The semiconductor ferroelectric memory transistor according to claim 18, wherein the Sr-Ca-Bi-Ta-O has a bismuth layered perovskite-type crystal structure.

20. The semiconductor ferroelectric memory transistor according to claim 19, wherein the insulator has a film thickness of 250 nm or less.

21. The semiconductor ferroelectric memory transistor according to claim 19, wherein the first insulator has a film thickness of 15 nm or less.

22. The semiconductor ferroelectric memory transistor according to claim 18, wherein the first insulator is an oxide of hafnium, an oxide of hafnium and aluminum, an oxide which includes hafnium, an oxide of strontium and titanium, a composite oxide of two or more of any of these, or an oxide layer stack of two or more of any of these.

23. The semiconductor ferroelectric memory transistor according to claim 18, wherein the insulator has a film thickness of 250 nm or less.

24. The semiconductor ferroelectric memory transistor according to claim 18, wherein the first insulator has a film thickness of 15 nm or less.

25. The semiconductor ferroelectric memory transistor according to claim 17,
wherein the insulator is comprised of a first insulator and a second insulator stacked on the body in that order, and
wherein the second insulator is the ferroelectric insulator comprising an oxide of strontium, calcium, bismuth, and tantalum, and the oxide of strontium, calcium, bismuth represented by the Sr-Ca-Bi-Ta-O.

26. The semiconductor ferroelectric memory transistor according to claim 25, wherein the insulator has a film thickness of 250 nm or less.

27. The semiconductor ferroelectric memory transistor according to claim 17, wherein the Sr-Ca-Bi-Ta-O has a bismuth layered perovskite-type crystal structure.

28. The semiconductor ferroelectric memory transistor according to claim 27, wherein the insulator has a film thickness of 250 nm or less.

29. The semiconductor ferroelectric memory transistor according to claim 27, wherein the first insulator has a film thickness of 15 nm or less.

30. The semiconductor ferroelectric memory transistor according to claim 17, wherein the insulator has a film thickness of 250 nm or less.

31. A method of producing a semiconductor ferroelectric memory transistor, the method comprising:
cleaning a semiconductor body surface;
depositing an insulator;
forming a gate electrode conductor; and
providing a heat treatment, wherein
the semiconductor ferroelectric memory transistor comprises the semiconductor body having a source region and a drain region on which the insulator including a ferroelectric insulator comprising an oxide of strontium, calcium, bismuth, and tantalum represented by Sr-Ca-Bi-Ta-O and a gate electrode conductor are stacked in that order.

32. The method according to claim 31, wherein the heat treatment has a temperature of 760° C. to 833° C.

33. The method according to claim 31, wherein the insulator deposition step includes depositing the ferroelectric insulator comprised of an oxide of strontium, calcium, bismuth, and tantalum represented by the Sr-Ca-Bi-Ta-O via pulse laser deposition or sputtering using a plurality of oxide targets with different ratios of composition of strontium, calcium, bismuth, and tantalum.

* * * * *